(12) United States Patent
Sarigiannis et al.

(10) Patent No.: US 8,235,364 B2
(45) Date of Patent: Aug. 7, 2012

(54) REAGENT DISPENSING APPARATUSES AND DELIVERY METHODS

(75) Inventors: Demetrius Sarigiannis, Grand Island, NY (US); M. Mushtaq Ahmed, Pittsford, NY (US)

(73) Assignee: Praxair Technology, Inc., Danbury, CT (US)

( * ) Notice: Subject to any disclaimer, the term of this patent is extended or adjusted under 35 U.S.C. 154(b) by 471 days.

(21) Appl. No.: 12/612,073

(22) Filed: Nov. 4, 2009

(65) Prior Publication Data

US 2010/0117246 A1 May 13, 2010

Related U.S. Application Data

(60) Provisional application No. 61/113,325, filed on Nov. 11, 2008.

(51) Int. Cl.
B01F 3/04 (2006.01)

(52) U.S. Cl. ........................ 261/121.1; 141/63

(58) Field of Classification Search ............... 261/119.1, 261/121.1, 126; 141/47, 63, 302
See application file for complete search history.

(56) References Cited

U.S. PATENT DOCUMENTS

| | | |
|---|---|---|
| 3,696,830 A | 10/1972 | Janu |
| 3,930,591 A | 1/1976 | Hawerkamp |
| 4,140,735 A | 2/1979 | Schumacher |
| 4,734,999 A | 4/1988 | Fujisawa et al. |
| 5,335,821 A | 8/1994 | Osgar |
| 5,435,460 A | 7/1995 | Osgar |
| 5,511,692 A | 4/1996 | Willingham |
| 5,526,956 A | 6/1996 | Osgar |
| 5,607,002 A | 3/1997 | Siegele et al. |
| 5,657,786 A | 8/1997 | DuRoss et al. |
| 6,029,717 A | 2/2000 | Siegele et al. |
| 6,077,356 A | 6/2000 | Bouchard |
| 6,287,965 B1 | 9/2001 | Kang et al. |
| 6,342,277 B1 | 1/2002 | Sherman |
| 6,648,034 B1 | 11/2003 | Birtcher et al. |
| 6,966,348 B2 | 11/2005 | Steidl et al. |
| 7,077,388 B2 | 7/2006 | Stamp et al. |
| 7,100,441 B2 | 9/2006 | Williams et al. |
| 7,114,531 B2 * | 10/2006 | Silva .................... 141/3 |
| 7,300,038 B2 | 11/2007 | Gregg et al. |
| 2006/0011258 A1 | 1/2006 | Silva |
| 2006/0027281 A1 | 2/2006 | Silva |

FOREIGN PATENT DOCUMENTS

| | | |
|---|---|---|
| EP | 2108616 A1 | 10/2009 |
| EP | 2108617 A1 | 10/2009 |

OTHER PUBLICATIONS

Anonymous: "Condensible Vapor Delivery Vessel". Research Disclosure, Mason Publications, Hampshire, GB. vol. 305, No. 91, (Sep. 1, 1989) XP007114204 Issn: 0374-4353.

* cited by examiner

*Primary Examiner* — Robert A Hopkins
(74) *Attorney, Agent, or Firm* — Nilay S. Dalal; Iurie A. Schwartz

(57) ABSTRACT

This invention relates to a vapor or liquid phase reagent dispensing apparatus that may be used for dispensing vapor or liquid phase reagents such as precursors for deposition of materials in the manufacture of semiconductor materials and devices. The vapor phase reagent dispensing apparatus has a single port capable of receiving a carrier gas and dispensing a vapor phase reagent. The liquid phase reagent dispensing apparatus has a single port capable of receiving an inert gas and dispensing a liquid phase reagent.

21 Claims, 14 Drawing Sheets

US 8,235,364 B2

REAGENT DISPENSING APPARATUSES AND DELIVERY METHODS

RELATED APPLICATIONS

This application claims the benefit of U.S. Provisional Application Ser. No. 61/113,325, filed on Nov. 11, 2008; which is incorporated herein by reference.

FIELD OF THE INVENTION

This invention relates to vapor and liquid phase reagent dispensing apparatuses that may be used for dispensing vapor and liquid phase reagents respectively, such as precursors for deposition of materials in the manufacture of semiconductor materials and devices.

BACKGROUND OF THE INVENTION

High purity chemicals used in the semiconductor and pharmaceutical industries require special packaging to maintain their purity in storage. This is especially true for chemicals that react with air and/or moisture in the air. Such high purity chemicals are typically supplied in containers such as bubblers or ampoules.

Modern chemical vapor deposition and atomic layer deposition tools utilize bubblers or ampoules to deliver precursor chemicals to a deposition chamber. These bubblers or ampoules work by passing a carrier gas through a container of high purity liquid precursor chemical and carrying the precursor vapor along with the gas to the deposition chamber.

As integrated circuits have decreased in size, so have the dimensions of the internal components or features. As the sizes decreased, the need for more pure chemicals has correspondingly increased to minimize the effect of impurities. Suppliers therefore, must be able to not only manufacture high purity chemicals, but must also be able to deliver them in a container which will maintain the high purity.

The standard materials of construction for these containers shifted from the delicate quartz containers to stainless steel in the late 1990's. See, for example, U.S. Pat. No. 5,607,002. These containers are known in the industry either as bubblers or ampoules and are now routinely constructed of stainless steel, e.g., 316SS. See, for example, U.S. Pat. Nos. 3,930,591, 6,029,717 and 7,077,388.

Further, in most cases, it is necessary to heat the ampoule by some means in order to increase the vapor pressure of the precursor and thus increase the amount of chemical in the carrier gas. It is important to monitor the temperature of the liquid precursor chemical inside of the ampoule to control the vapor pressure.

It is also important to know when the liquid precursor chemical inside of the ampoule is close to running out so that it can be changed at the end of a chemical vapor deposition or atomic layer deposition process. If the ampoule should run dry in the middle of a process, the entire batch of wafers will be ruined resulting in a potential loss of millions of dollars. It is therefore desirable to leave as little liquid precursor chemical as possible inside of the ampoule to avoid wasting the valuable liquid precursor chemical. As the cost of chemical precursors increase, wasting as little chemical as possible becomes more important.

It would be desirable in the art to provide an easy to clean, vapor or liquid phase reagent dispensing apparatus which is capable of maintaining high purity of the precursor chemical and also increasing the usage of the precursor chemical in the apparatus, and correspondingly reducing waste thereof.

It would also be desirable to provide a simplified vapor or liquid phase reagent dispensing apparatus design that could reduce machining and welding operations of the apparatus, and impart flexibility so that the apparatus could be used for various customers requiring different ampoule inlet to outlet distances.

SUMMARY OF THE INVENTION

This invention relates in part to a vapor phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving a carrier gas and dispensing a vapor phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a bubbler extends;

said bubbler comprising a tube that extends through a centrally located portion of said first port portion and through said inner gas volume into the source chemical and through which a carrier gas can be bubbled into the source chemical to cause at least a portion of source chemical vapor to become entrained in said carrier gas to produce a flow of vapor phase reagent to said inner gas volume above the fill level, said tube having an inlet end located generally vertically and exteriorly from said first port portion and an outlet end located generally adjacent to the vessel bottom wall member; and said first port portion having interstitial space between said tube and said port side wall member through which said vapor phase reagent can be dispensed from the inner gas volume of said vessel.

This invention also relates in part to method for delivery of a vapor phase reagent to a deposition chamber comprising:

(a) providing a vapor phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving a carrier gas and dispensing a vapor phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a bubbler extends;

said bubbler comprising a tube that extends through a centrally located portion of said first port portion and through said inner gas volume into the source chemical and through which a carrier gas can be bubbled into the source chemical to cause at least a portion of source chemical vapor to become entrained in said carrier gas to produce a flow of vapor phase reagent to said inner gas volume above the fill level, said tube having an inlet end located generally vertically and exteriorly from said first port portion and an outlet end located generally adjacent to the vessel bottom wall member;

said first port portion having interstitial space between said tube and said port side wall member through which said vapor phase reagent can be dispensed from the inner gas volume of said vessel;

said bubbler having a carrier gas feed inlet fitting connected thereto;

a carrier gas feed line extending from the carrier gas feed inlet fitting upwardly and exteriorly from the bubbler for delivery of carrier gas into the interior volume of the vessel, the carrier gas feed line containing a carrier gas flow control valve therein for control of flow of the carrier gas therethrough;

said third port portion having a vapor phase reagent outlet fitting connected thereto; and a vapor phase reagent discharge line extending from the vapor phase reagent outlet fitting upwardly and exteriorly from the third port portion for removal of vapor phase reagent from the interior volume of the vessel, the vapor phase reagent discharge line containing a vapor phase reagent flow control valve therein for control of flow of the vapor phase reagent therethrough;

(b) adding source chemical to said vapor phase reagent dispensing apparatus;

(c) heating the source chemical in said vapor phase reagent dispensing apparatus to a temperature sufficient to vaporize the source chemical to provide vapor phase reagent;

(d) feeding a carrier gas into said vapor phase reagent dispensing apparatus through said carrier gas feed line and said tube;

(e) withdrawing the vapor phase reagent and carrier gas from said vapor phase reagent dispensing apparatus through said vapor phase reagent discharge line; and (f) feeding the vapor phase reagent and carrier gas into said deposition chamber.

This invention further relates in part to liquid phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving an inert gas and dispensing a liquid phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a diptube extends;

said diptube comprising a tube that extends through a centrally located portion of said first port portion and through said inner gas volume into the source chemical and through which liquid phase reagent can be dispensed from said apparatus, said diptube having an outlet end located generally vertically and exteriorly from said first port portion and an inlet end located generally adjacent to the vessel bottom wall member; and said first port portion having interstitial space between said tube and said port side wall member through which said inert gas can be fed to the inner gas volume above the fill level to pressurize the inner gas volume above the fill level.

This invention yet further relates in part to method for delivery of a vapor phase reagent to a deposition chamber comprising:

(a) providing a liquid phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving an inert gas and dispensing a liquid phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a diptube extends;

said diptube comprising a tube that extends through a centrally located portion of said first port portion and through said inner gas volume into the source chemical and through which liquid phase reagent can be dispensed from said apparatus, said diptube having an outlet end located generally vertically and exteriorly from said first port portion and an inlet end located generally adjacent to the vessel bottom wall member;

said first port portion having interstitial space between said tube and said port side wall member through which said inert gas can be fed to the inner gas volume above the fill level to pressurize the inner gas volume above the fill level;

said third port portion having an inert gas feed inlet fitting connected thereto;

an inert gas feed line extending from the inert gas feed inlet fitting upwardly and exteriorly from the third port portion for delivery of inert gas into the interior volume of the vessel, the inert gas feed line containing an inert gas flow control valve therein for control of flow of the inert gas therethrough;

said diptube having a liquid phase reagent outlet fitting connected thereto; and a liquid phase reagent discharge line extending from the liquid phase reagent outlet fitting upwardly and exteriorly from the first port portion for removal of liquid phase reagent from the interior volume of the vessel, the liquid phase reagent discharge line optionally containing a liquid phase reagent flow control valve therein for control of flow of the liquid phase reagent therethrough;

(b) adding liquid phase reagent to said liquid phase reagent dispensing apparatus;

(c) optionally heating a solid source chemical in said liquid phase reagent dispensing apparatus to a temperature sufficient to melt the solid source chemical to provide liquid phase reagent;

(d) feeding an inert gas into said liquid phase reagent dispensing apparatus through said inert gas feed line;

(e) withdrawing the liquid phase reagent from said liquid phase reagent dispensing apparatus through said tube and said liquid phase reagent discharge line;

(f) providing a vaporization apparatus comprising:

a vessel configured to form an internal vessel compartment to vaporize the liquid phase reagent;

said liquid phase reagent discharge line connecting the liquid phase reagent dispensing apparatus to said vaporization apparatus;

a portion of the vaporization apparatus having a carrier gas feed inlet opening through which carrier gas can be fed into said vaporization apparatus to cause vapor of said liquid phase reagent to become entrained in said carrier gas to produce vapor phase reagent;

a portion of the vaporization apparatus having a vapor phase reagent outlet opening through which said vapor phase reagent can be dispensed from said vaporization apparatus;

a carrier gas feed line extending from the carrier gas feed inlet opening exteriorly from the vaporization apparatus for delivery of carrier gas into said vaporization apparatus, the carrier gas feed line containing one or more carrier gas flow control valves therein for control of flow of the carrier gas therethrough; and a vapor phase reagent discharge line extending from the vapor phase reagent outlet opening exteriorly from the vaporization apparatus for removal of vapor phase reagent from said vaporization apparatus to said deposition chamber, the vapor phase reagent discharge line optionally containing one or more vapor phase reagent flow control valves therein for control of flow of the vapor phase reagent therethrough;

(g) feeding the liquid phase reagent into said vaporization apparatus;

(h) heating the liquid phase reagent in said vaporization apparatus to a temperature sufficient to vaporize the liquid phase reagent to provide said vapor phase reagent;

(i) feeding a carrier gas into said vaporization apparatus through said carrier gas feed line;

(j) withdrawing the vapor phase reagent and carrier gas from said vaporization apparatus through said vapor phase reagent discharge line; and (k) feeding the vapor phase reagent and carrier gas into said deposition chamber.

This invention also relates in part to a vapor phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said top wall member having a single port capable of receiving a carrier gas and dispensing a vapor phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a tube extends;

said tube extends through a centrally located portion of said first port portion into said inner gas volume and through which a carrier gas can be fed into said inner gas volume above the fill level to cause vapor of said source chemical to become entrained in said carrier gas to produce vapor phase reagent, said tube having an inlet end located generally vertically and exteriorly from said first port portion and an outlet end located in said inner gas volume; and said first port portion having interstitial space between said tube and said port side wall member through which said vapor phase reagent can be dispensed from the inner gas volume of said vessel.

This invention further relates in part to method for delivery of a vapor phase reagent to a deposition chamber comprising:

(a) providing a vapor phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said top wall member having a single port capable of receiving a carrier gas and dispensing a vapor phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a tube extends;

said tube extends through a centrally located portion of said first port portion into said inner gas volume and through which a carrier gas can be fed into said inner gas volume above the fill level to cause vapor of said source chemical to become entrained in said carrier gas to produce vapor phase reagent, said tube having an inlet end located generally vertically and exteriorly from said first port portion and an outlet end located in said inner gas volume;

said first port portion having interstitial space between said tube and said port side wall member through which said vapor phase reagent can be dispensed from the inner gas volume of said vessel;

said tube having a carrier gas feed inlet fitting connected thereto;

a carrier gas feed line extending from the carrier gas feed inlet fitting upwardly and exteriorly from the tube for delivery of carrier gas into the interior volume of the vessel, the carrier gas feed line containing a carrier gas flow control valve therein for control of flow of the carrier gas therethrough;

said third port portion having a vapor phase reagent outlet fitting connected thereto; and a vapor phase reagent discharge line extending from the vapor phase reagent outlet fitting upwardly and exteriorly from the third port portion for removal of vapor phase reagent from the interior volume of the vessel, the vapor phase reagent discharge line containing a vapor phase reagent flow control valve therein for control of flow of the vapor phase reagent therethrough;

(b) adding source chemical to said vapor phase reagent dispensing apparatus;

c) heating the source chemical in said vapor phase reagent dispensing apparatus to a temperature sufficient to vaporize the source chemical to provide vapor phase reagent;

d) feeding a carrier gas into said vapor phase reagent dispensing apparatus through said carrier gas feed line and said tube;

e) withdrawing the vapor phase reagent and carrier gas from said vapor phase reagent dispensing apparatus through said vapor phase reagent discharge line; and f) feeding the vapor phase reagent and carrier gas into said deposition chamber.

The vapor phase reagent dispensing apparatus or assembly of the invention may be employed in a wide variety of process systems, including for example chemical vapor deposition systems wherein the vapor phase reagent from the supply vessel is passed to a chemical vapor deposition chamber for deposition of a material layer on a substrate therein from the source vapor.

The vapor or liquid phase reagent dispensing apparatus or assembly of the invention is easy to clean, maintains purity of the liquid precursor chemical, increases usage rate of the liquid or solid precursor chemical and thereby reduces waste.

Other aspects, features and embodiments of the invention will be more fully apparent from the ensuing disclosure and appended claims.

DETAILED DESCRIPTION OF THE INVENTION

In accordance with this invention, an ampoule has been developed with one combined inlet and outlet port, instead of two or more separate ports as disclosed in the prior art. The single port reduces machining and welding operations involved with ampoules. This invention also provides an ampoule designed so that it can use a single, standard lid and have the flexibility to be used for various customers requiring different inlet to outlet distances. This invention is directed towards combining the two ports that enable fluid communication between the ampoule and the chemical delivery manifold into one. The ampoule may optionally have a separate fill port or level sensor port or thermocouple port, or these ports may be incorporated into the single port as well.

Figure 1:
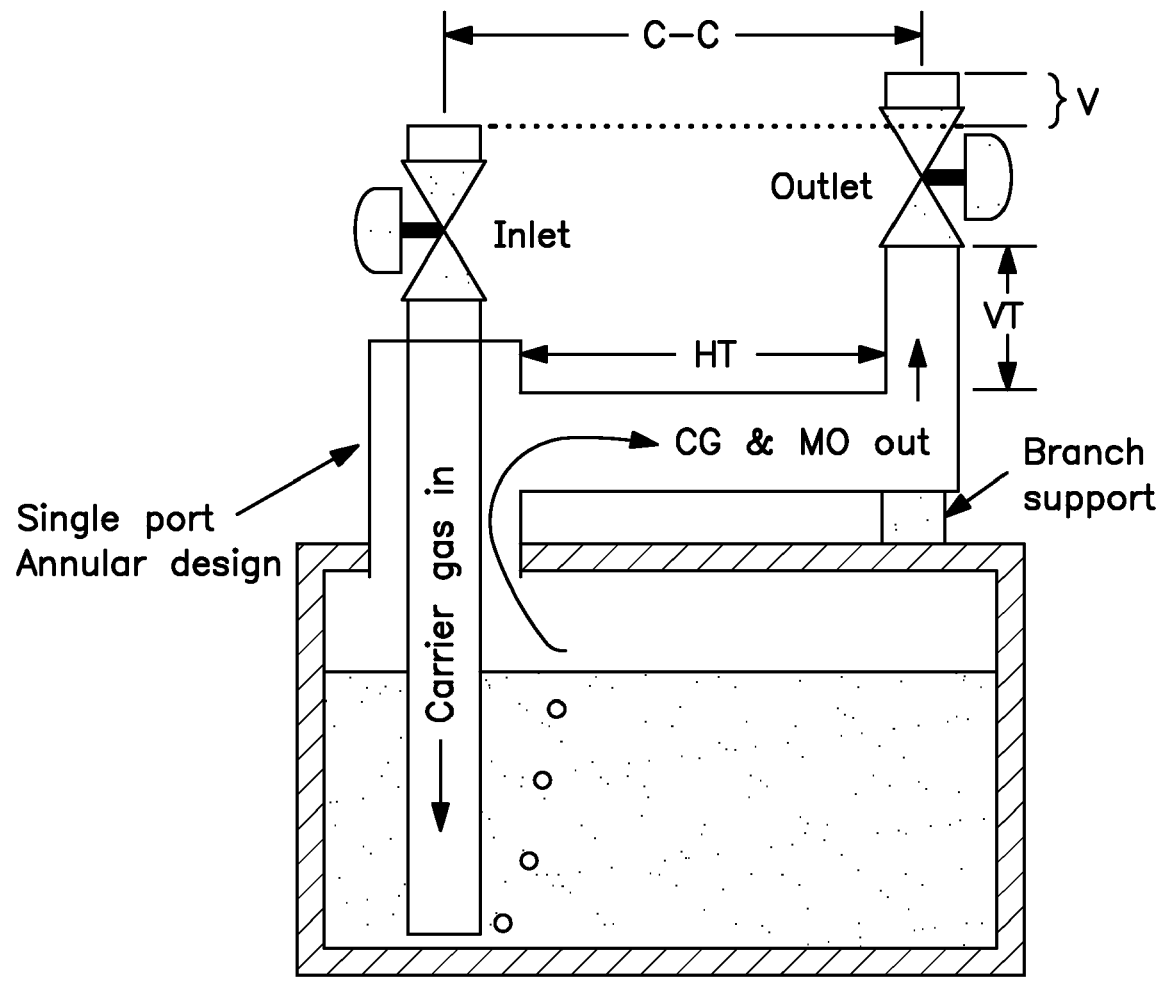
FIG. 1 is a schematic representation of a vapor phase reagent dispensing apparatus having a bubbler, shown in cross-section. The C-C distance is dependant on machining of the top wall member.

The single-port ampoule design, in the bubbler configuration, is shown in FIG. 1. This ampoule uses a single port to introduce the carrier gas (CG) to the ampoule bubbler tube and remove the vapor stream which includes the organometallic precursor compound (MO). In this case, a single lid with a single feed-through port may be fabricated to accommodate various center-to-center distance (C-C) and vertical offset distances (V) between the inlet and outlet. The center-to-center distance may be adjusted by changing tube length (HT) while the inlet to outlet vertical offset may be adjusted by changing tube height (VT). In this case, a single lid design for a given ampoule diameter can be used enabling consolidation of parts and inventory reduction. Additionally, changes to the tube lengths can be made after the ampoule body itself is fabricated, allowing one to stock ampoule bodies or change the C-C distance on an existing ampoule. The ampoules of this invention can use standard valves and can hook up to existing manifolds.

Figure 2:
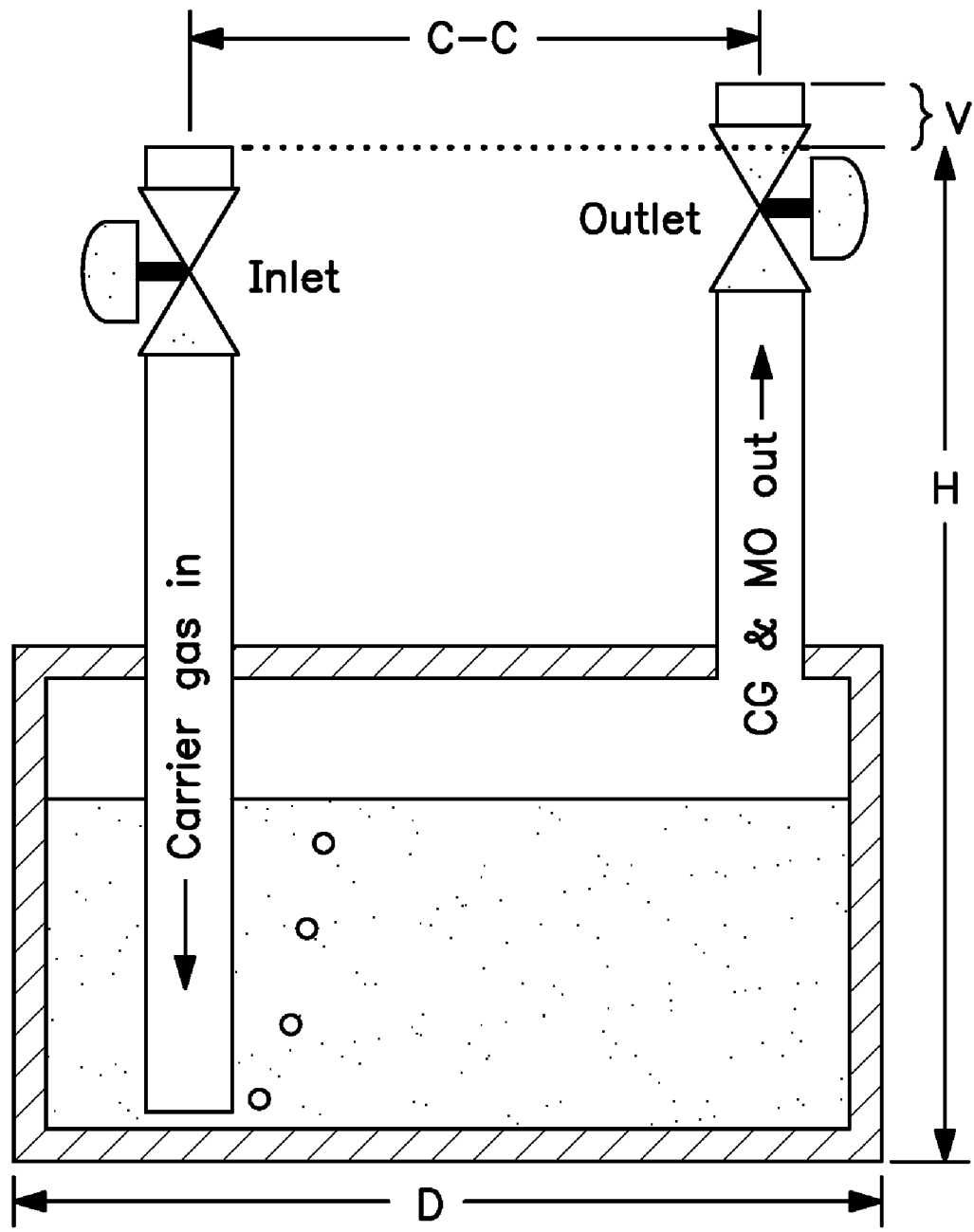
FIG. 2 is a schematic representation of a conventional 2-port vapor phase reagent dispensing apparatus having a bubbler, shown in cross-section. The C-C distance is dependant on machining of the top wall member.
Figure 3:
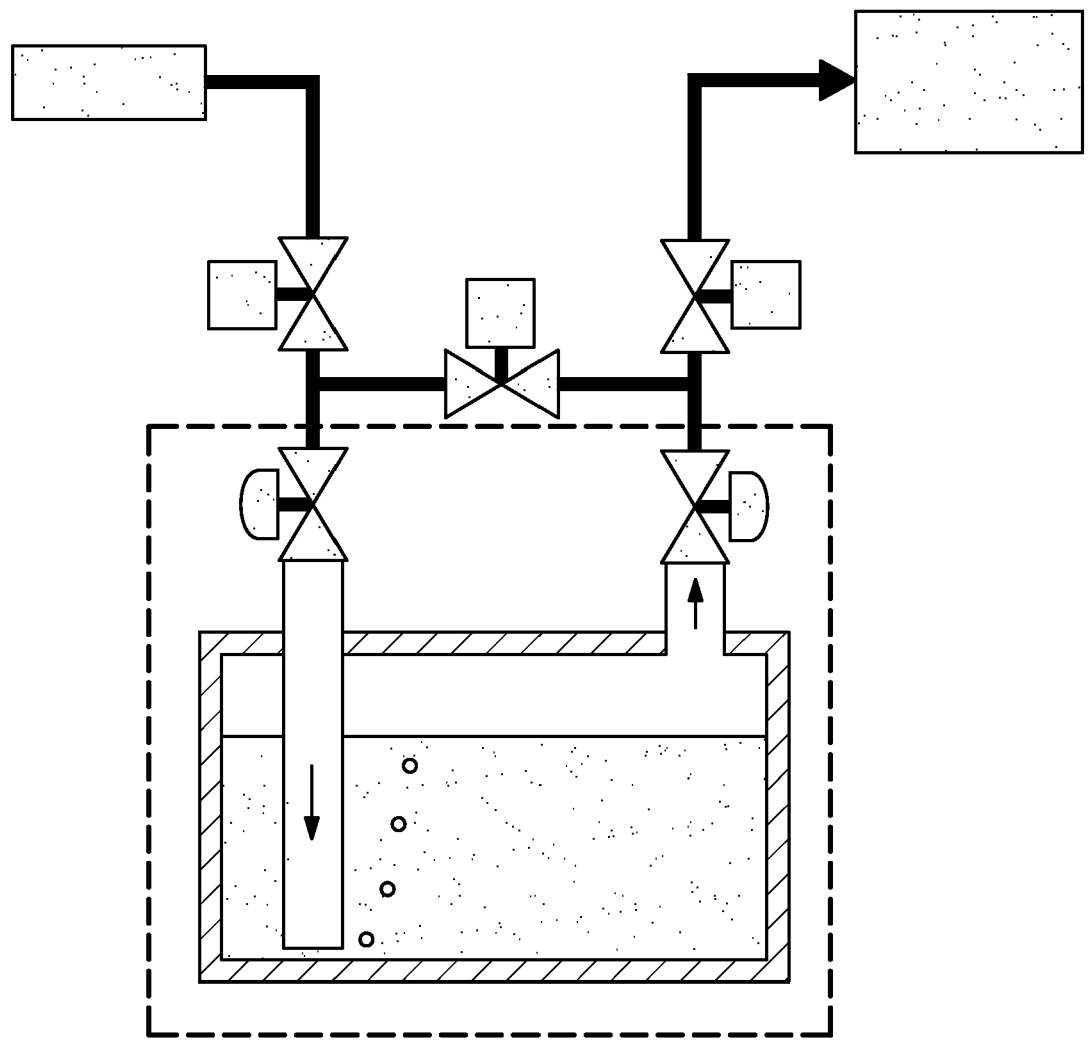
FIG. 3 is a schematic representation of a conventional 2-port vapor phase reagent dispensing apparatus having a bubbler, shown in cross-section. The apparatus is hooked to a chemical delivery manifold. In this case, the bypass and auto control valves are part of the manifold.
Figure 4:
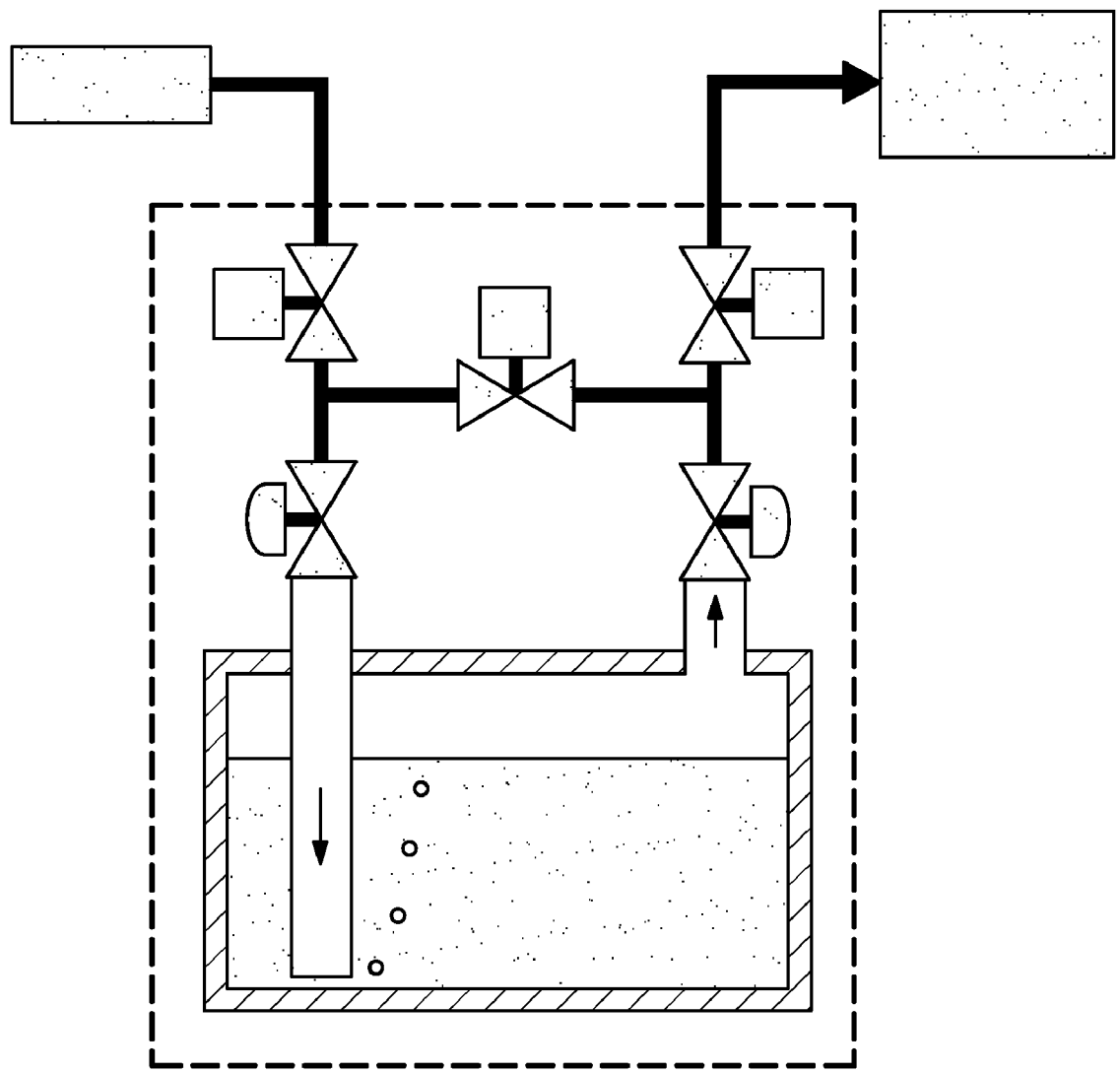
FIG. 4 is a schematic representation of a conventional 2-port vapor phase reagent dispensing apparatus having a bubbler, shown in cross-section. The apparatus is hooked to a chemical delivery manifold. In this case, the bypass and auto control valves are part of the removable bubbler.

A conventional 2-port bubbler configuration is shown in FIG. 2. The schematic representation of a conventional 2-port vapor phase reagent dispensing apparatus having a bubbler, as depicted in FIG. 2, is shown in cross-section. The C-C distance is dependant on machining of the top wall member. The bubbler can also be used in reverse with push gas entering through the outlet valve to force liquid up and out the tube and to a vaporizer.

An advantage provided by this invention is that, in comparison with conventional 2-port bubbler configurations, there is one less port for the ampoule to develop a leak. There is only one port that enables fluid communication between the ampoule and the manifold in the lid to develop a leak, rather than two ports as with conventional ampoules. These ports on conventional ampoules are more at risk for leaks because of the height of the valve assembly sticking up on top of them. The single port solution is more robust to shipping in that 1) the single port is typically a larger diameter tube welded into the hole, 2) the branch support is welded to support one valve that would otherwise have its own separate port, and 3) for a given tube size and impact during a drop, an ampoule with 2 ports has twice the probability of developing a leak than an ampoule with one port and a blind support.

Another advantage provided by this invention is the quick turn-around time on meeting custom connection dimensions with pre-fabricated parts.

Yet another advantage relates to parts consolidation and reduction in machining steps. As previously stated, this invention allows a lid with one hole for both the inlet and outlet to be used rather than two holes (one for the inlet and one for the outlet). This design allows a fabrication shop to stock one lid and one dip tube assembly and then cut the horizontal component of the dip tube assembly to length prior to final fabrication. The fabrication of this horizontal distance between valves on the annular dip tube assembly involves cutting and welding tubing. Changing the distance by machining two ports in a blank lid involves milling through thicker (typically ¼ to 1" thick) stainless steel plate, and final polishing.

The advantage in quick fabrication time is difficult to quantify as a sales figure, however customers in the semiconductor industry are looking for quick response from their suppliers. The value in providing a custom inlet to outlet distance on an ampoule can be economically manifested as market captured due to a faster response time than competitors.

Figure 5:
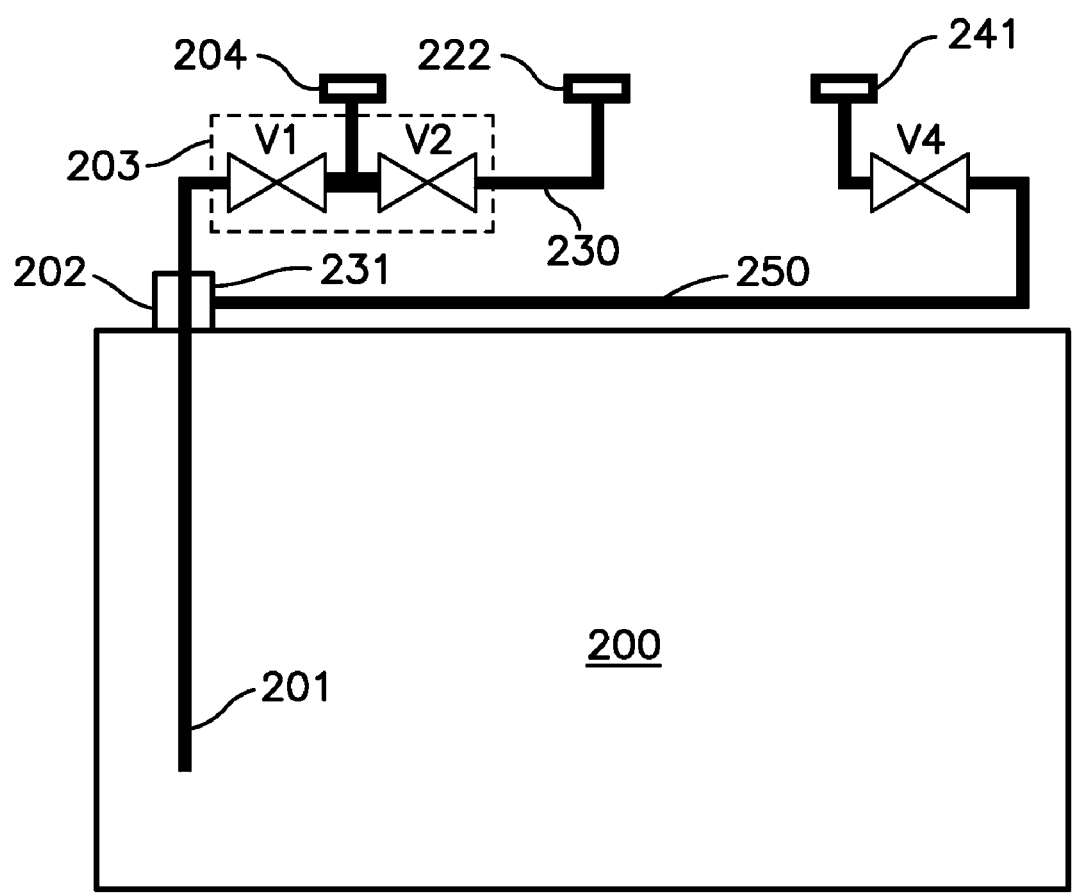
FIG. 5 is a schematic representation of a vapor or liquid phase reagent dispensing apparatus having multiple valves on inlet and outlet, shown in cross-section.

In an embodiment of this invention illustrated in FIG. 5, the ampoule consists of the body (200) which comprises a base, wall(s) and lid which may be all welded or multiple components bolted together as is sometimes the practice. The single port (202) into the ampoule consists of a dip tube (201) and an annular feed tube (231). The annular tube (250) has flow communication directly with the head space and the push gas valve (V4), and is connected to a source of push gas via fitting (241). In this embodiment, valve (V4) is a manual valve, although it could easily be automatic (pneumatic or electrically actuated). The dip tube (201) of the single port ampoule is in flow communication with valve (V1), which allows the liquid to flow to the outlet at fitting (204). In this case, valve (V1) is a manual valve, although this could also be an automatic valve with a pneumatic or electric actuator. The horizontal distance between the inlet (241) and the outlet (204) can be adjusted by varying the length of the horizontal annular tube, (250).

On the outlet assembly, fitting (222) could be connected to purge gas, vacuum, solvent or a combination of all three to be used to purge or clean the precursor from the lines. Valve (V2) allows this flow communication between (204) and (222) through tube (230). Valve (V2) is preferentially an automated valve with pneumatic actuation, however it could be electrical or a manual valve. Valves (V1) and (V2) may be two separate valves or, preferentially, a single body, dual opposing actuator multi-port block valve (203) commonly made by valve manufactures such as Swagelok, AP Tech, Fujikin, and the like. An illustrative valve is described in detail in U.S. Pat. No. 6,966,348.

Fittings (204), (222) and (241) may be of the face-seal type manufactured by companies such as Swagelok (their VCR line) or Fujikin (their UJR face seal or the lower dead-space UPG fittings). Valves (V1), (V2) and (V4) would be suited for use in the semiconductor industry and typically be of the style manufactured by a company such as of diaphragm, bellows, ball and others manufactured by companies such as Swagelok, Fujikin, AP Tech, Parker, and the like.

The ampoule may be heated or cooled depending on the vapor pressure of the chemical precursor contained within. Due to the single port design, attention to heating of the horizontal tube (250) should be given special attention to assure there is no preferential condensation of precursor in that leg. This is particularly important if the ampoule is being used in reverse as a bubbler with (204) as the carrier gas inlet and (241) as the carrier gas/precursor outlet. Any time heating or cooling is required, it is important that a relatively uniform temperature is maintained from the valves down to avoid hot spots that can lead to decomposition or cold spots that could lead to condensation and subsequent clogging.

Figure 6:
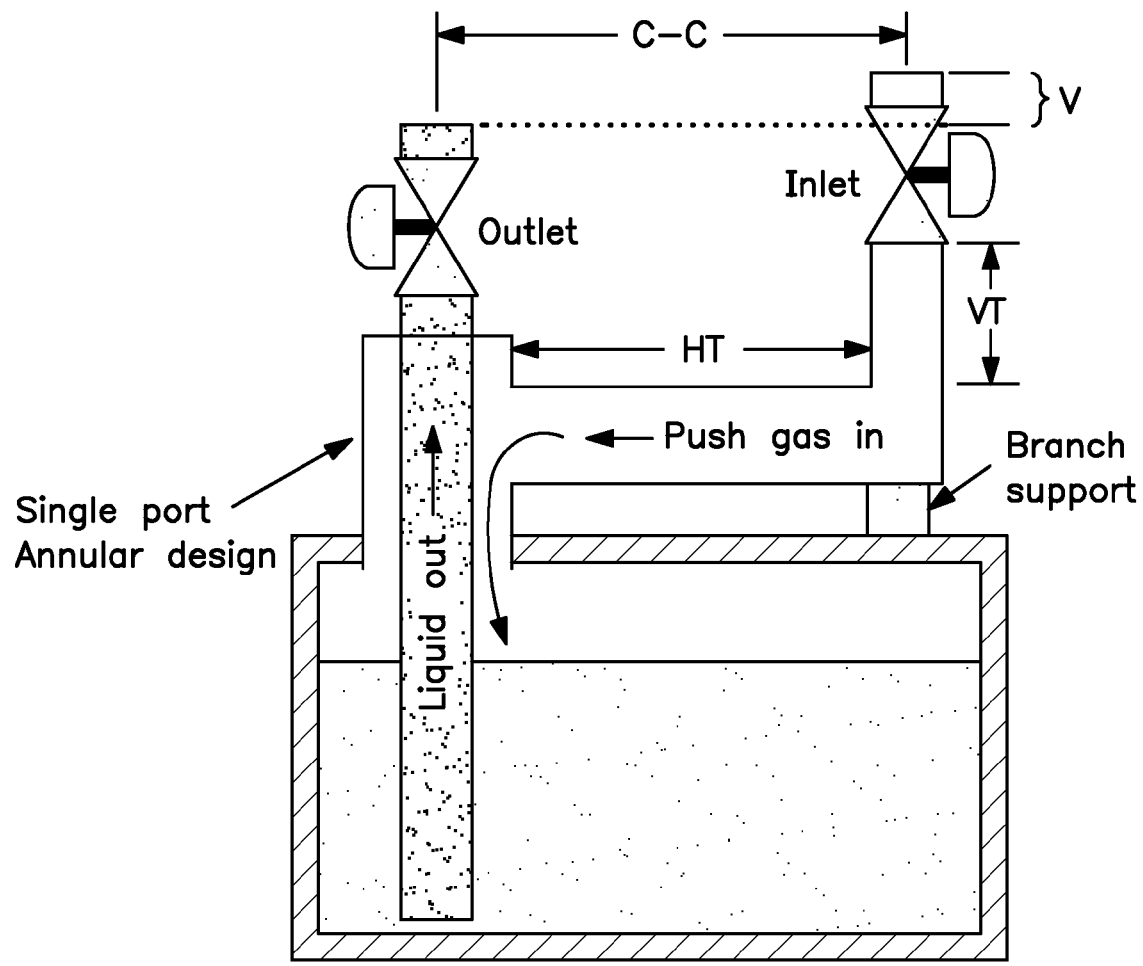
FIG. 6 is a schematic representation of a liquid phase reagent dispensing apparatus having a diptube, shown in cross-section. The push gas enters the ampoule head space from the outer tube, forcing the liquid organometallic precursor up the diptube and out of the ampoule.
Figure 7:
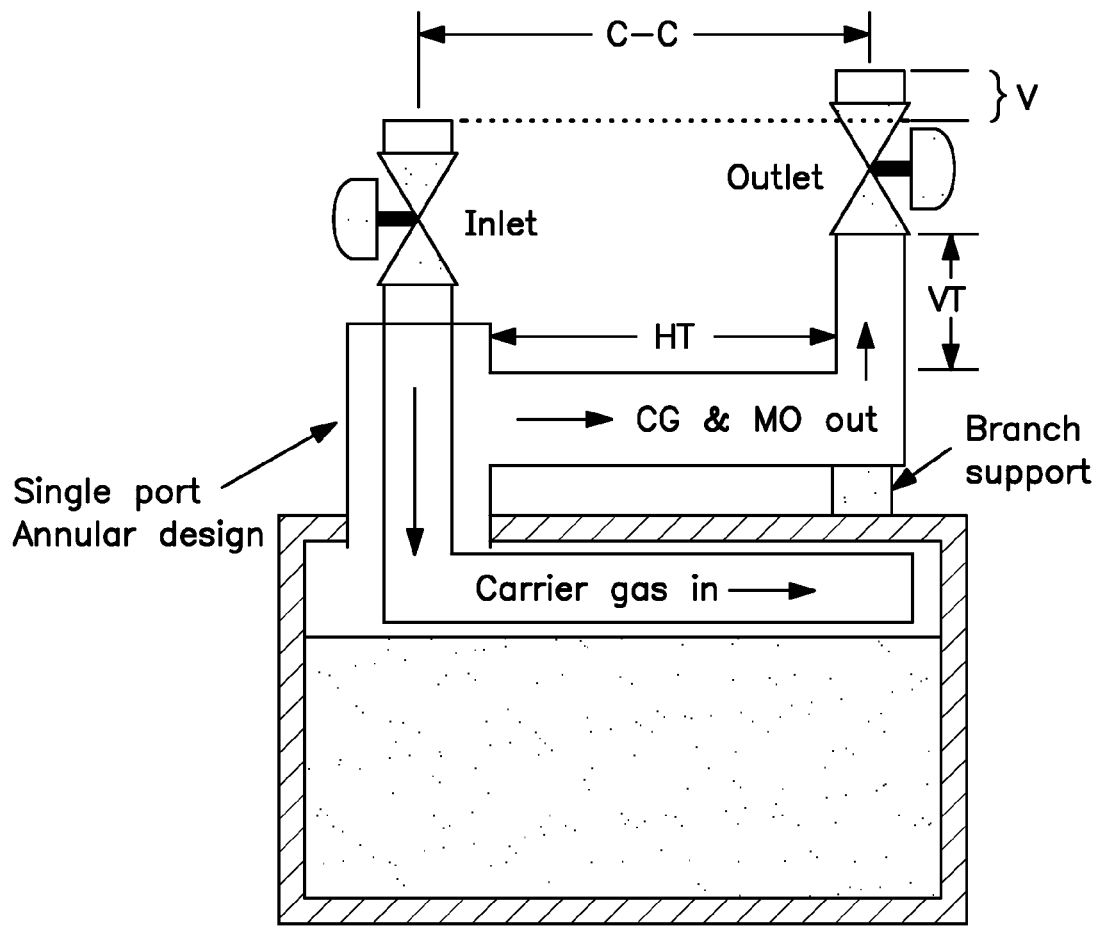
FIG. 7 is a schematic representation of a vapor phase reagent dispensing apparatus having a tube, shown in cross-section. A single port is used to introduce carrier gas to the ampoule head space on one end in order to fully sweep the area above the liquid surface and carry organometallic precursor vapor out of the ampoule through the annular space of the port.

There are multiple modes that this can be practiced in addition to the bubbler mode in FIG. 1 above. For example, FIG. 6 is a schematic representation of a liquid phase reagent dispensing apparatus having a diptube, shown in cross-section. The push gas enters the ampoule head space from the outer tube, forcing the liquid organometallic precursor up the diptube and out of the ampoule. FIG. 7 is a schematic representation of a vapor phase reagent dispensing apparatus having a tube, shown in cross-section. A single port is used to introduce carrier gas to the ampoule head space on one end in order to fully sweep the area above the liquid surface and carry organometallic precursor vapor out of the ampoule through the annular space of the port.

Figure 8:
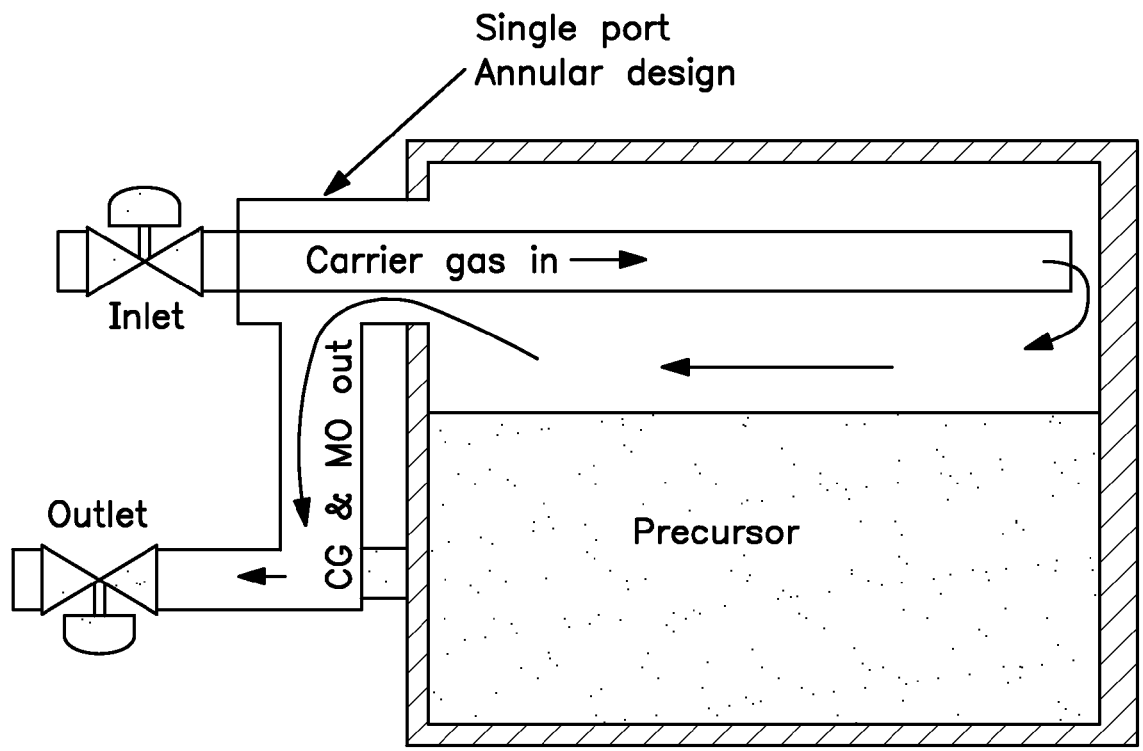
FIG. 8 is a schematic representation of a vapor phase reagent dispensing apparatus having a tube, shown in cross-section. The valves are on the side of the container.
Figure 9:
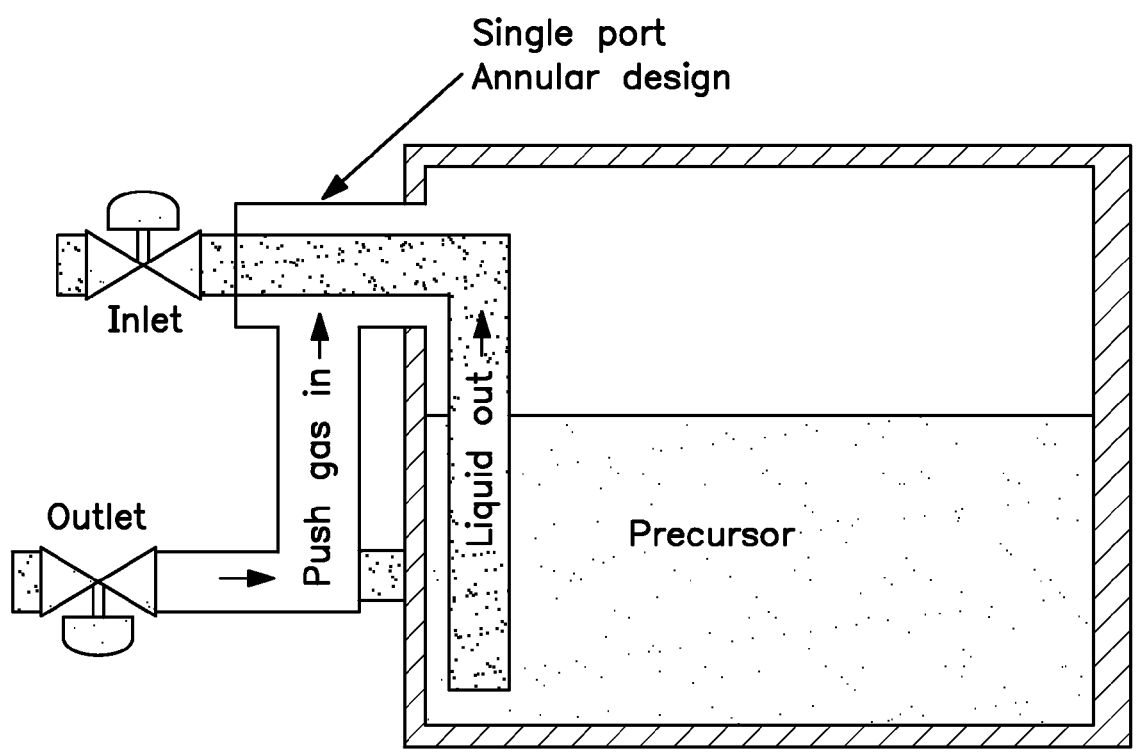
FIG. 9 is a schematic representation of a liquid phase reagent dispensing apparatus having a diptube, shown in cross-section. The ampoule is on its side.
Figure 10:
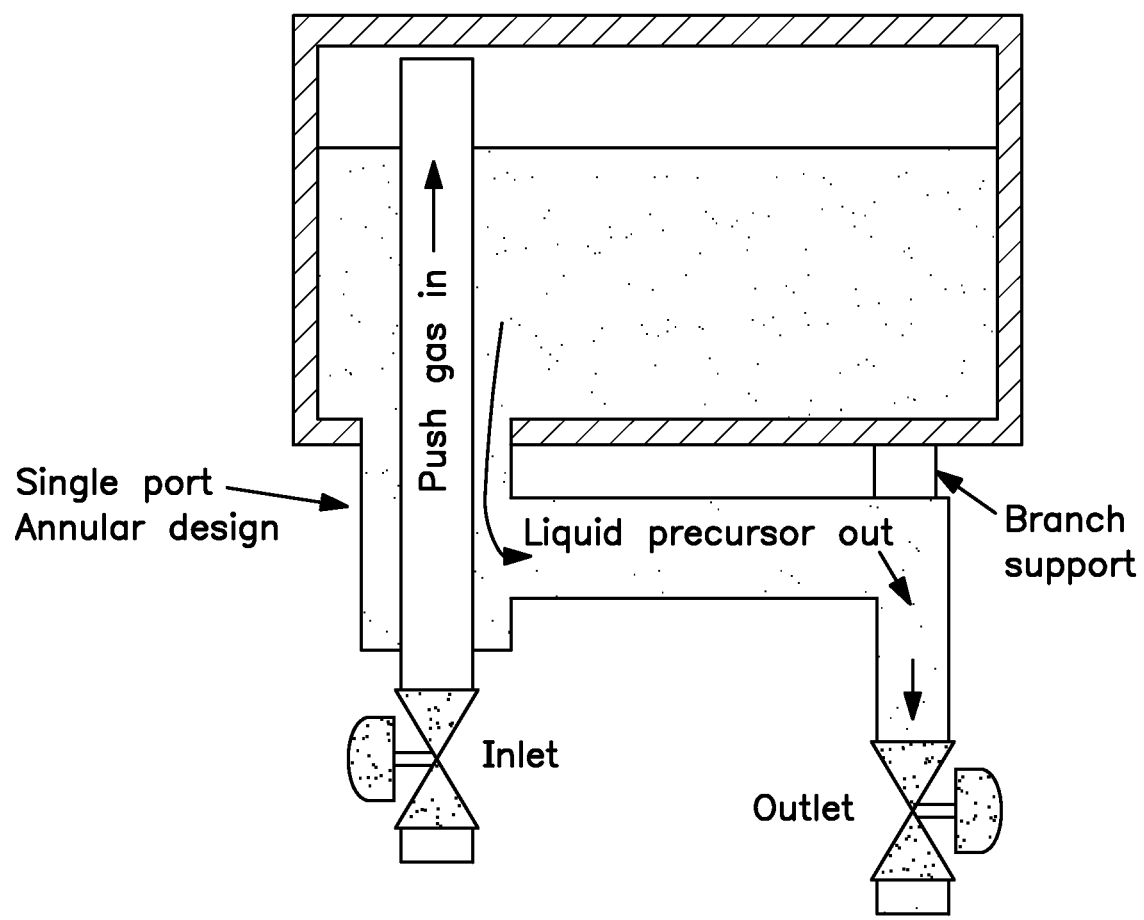
FIG. 10 is a schematic representation of a liquid phase reagent dispensing apparatus having a diptube, shown in cross-section. The apparatus is in vertical liquid delivery mode. The dip tube introduces carrier gas to push liquid out of ampoule. This affords high liquid utilization. A level sensor can be mounted from the top or bottom or on the liquid out line.

Various ampoule configurations can also be used in this invention. For example, FIG. 8 is a schematic representation of a vapor phase reagent dispensing apparatus having a tube, shown in cross-section. The valves are on the side of the container. FIG. 9 is a schematic representation of a liquid phase reagent dispensing apparatus having a diptube, shown in cross-section. The ampoule is on its side. FIG. 10 is a schematic representation of a liquid phase reagent dispensing apparatus having a diptube, shown in cross-section. The apparatus is in vertical liquid delivery mode. The dip tube introduces carrier gas to push liquid out of ampoule. This affords high liquid utilization. A level sensor can be mounted from the top or bottom or on the liquid out line.

In addition to various modes of operation above, the ampoules of this invention offer flexibility in container shape, e.g., cylindrical, cube, rectangular prism, and the like. In all modes of operation, a level sensor, either continuous or discreet, can be mounted into the container at the appropriate location(s) to sense the liquid level. The ampoules of this invention, besides dispensing chemical, can be used in the opposite mode to collect chemical. Examples include use as a waste collection tank, overflow reservoir, the refill process on a tool or at the factory.

Figure 11:
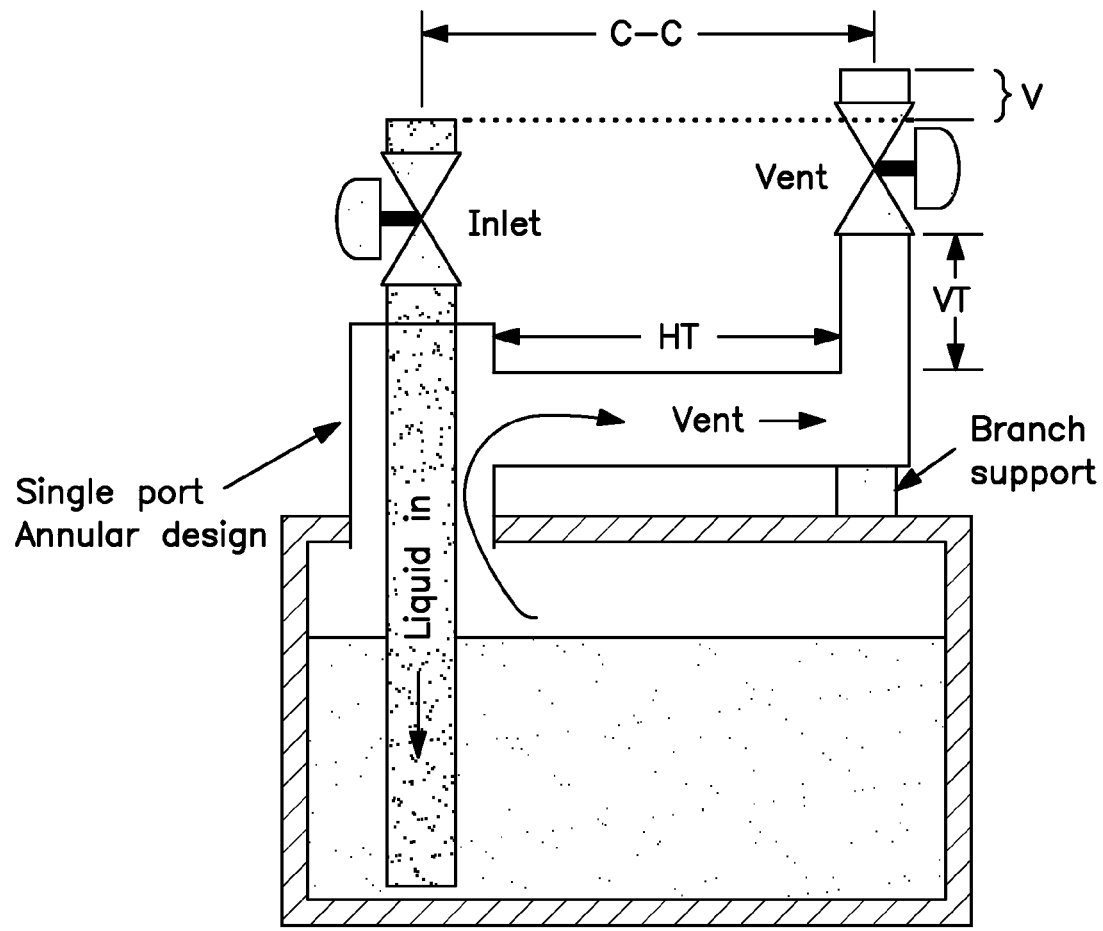
FIG. 11 is a schematic representation of a vapor phase reagent dispensing apparatus having a tube, shown in cross-section. The ampoule design is in fill mode. A single port is used to introduce the liquid to the ampoule while simultaneously venting the head space to avoid building up an excessive head pressure.

An example of one of these being filled is shown in FIG. 11. FIG. 11 is a schematic representation of a vapor phase reagent dispensing apparatus having a tube, shown in cross-section. The ampoule design is in fill mode. A single port is used to introduce the liquid to the ampoule while simultaneously venting the head space to avoid building up an excessive head pressure.

Figure 12:
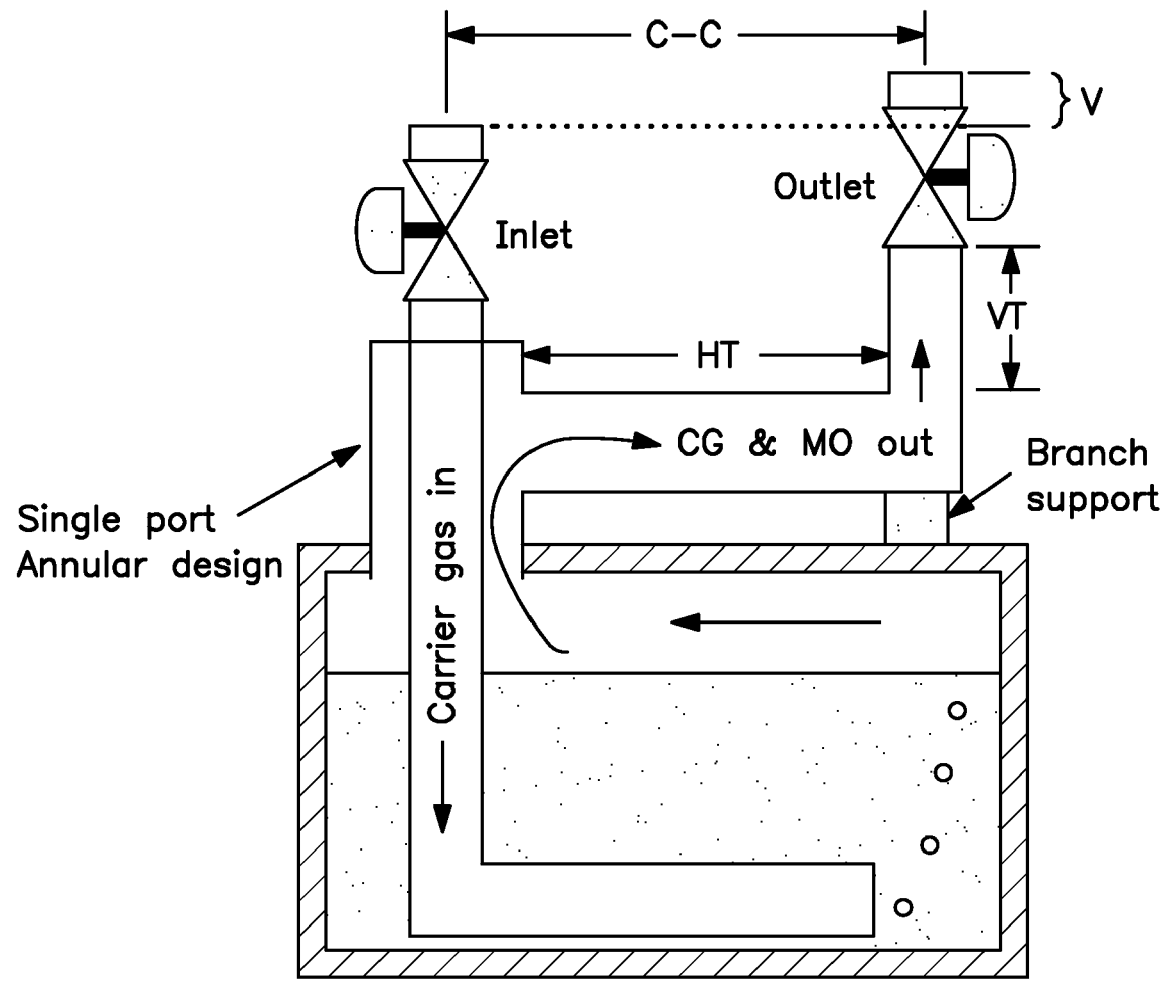
FIG. 12 is a schematic representation of a vapor phase reagent dispensing apparatus having a bubbler, shown in cross-section. This single-port ampoule design introduces the carrier gas to the liquid via a diptube with 90° extension. The bend on the dip allows the carrier gas to be delivered at a point far from the single port inlet/outlet resulting in the carrier gas flowing through the liquid then across the head-space for maximum saturation.

Another alternative way to practice is shown in FIG. 12. FIG. 12 is a schematic representation of a vapor phase reagent dispensing apparatus having a bubbler, shown in cross-section. This single-port ampoule design introduces the carrier gas to the liquid via a diptube with 90° extension. The bend on the dip allows the carrier gas to be delivered at a point far from the single port inlet/outlet resulting in the carrier gas flowing through the liquid then across the head-space for maximum saturation. The end of the dip tube is extended to reach across the ampoule, providing a longer flow path over the precursor for the carrier gas on its way out. This single port ampoule could also be used in solid source ampoule designs where the gas needs to be delivered to the bottom of a stack of trays such as disclosed in U.S. Pat. No. 7,300,038 or dispersed through a porous frit or showerhead.

Figure 13:
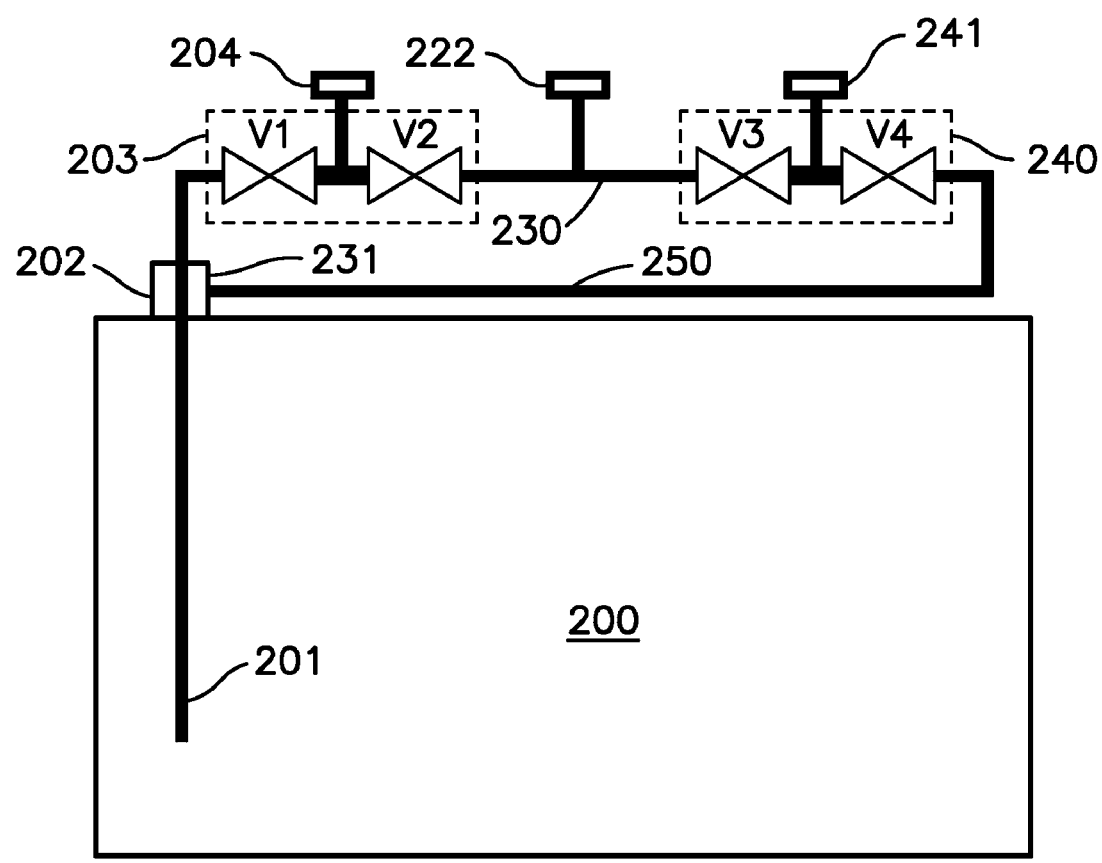
FIG. 13 is a schematic representation of a vapor or liquid phase reagent dispensing apparatus having multiple valves on inlet and outlet, shown in cross-section.

Additionally, the single port ampoule is shown generically configured in FIG. 13. FIG. 13 is a schematic representation of a vapor or liquid phase reagent dispensing apparatus having multiple valves on inlet and outlet, shown in cross-section. In this FIG. 13, the ampoule consists of the body (200) which comprises a base, wall(s) and lid which may be all welded or multiple components bolted together as is sometimes the practice. The single port (202) into the ampoule consists of a dip tube (201) and an annular feed tube (231). The annular tube (250) has flow communication directly with the head space and the dual actuator block valve (240). The inlet and outlet are each shown with two actuators that may either be independent valves or single body, dual actuator block valves and allow the inlet (241) or outlet (204) to have flow communication with a purge/vacuum/solvent flush/refill line (222) through tube (230). Preferably, they are single body, dual opposing actuator multi-port block valves (203) and (240). These block valves (203) (includes valves (V1) and (V2)) and (240) (includes valves (V3) and (V4)) may be replaced by standard single actuator, two port valves if access to the third port (222) is not needed.

Figure 14:
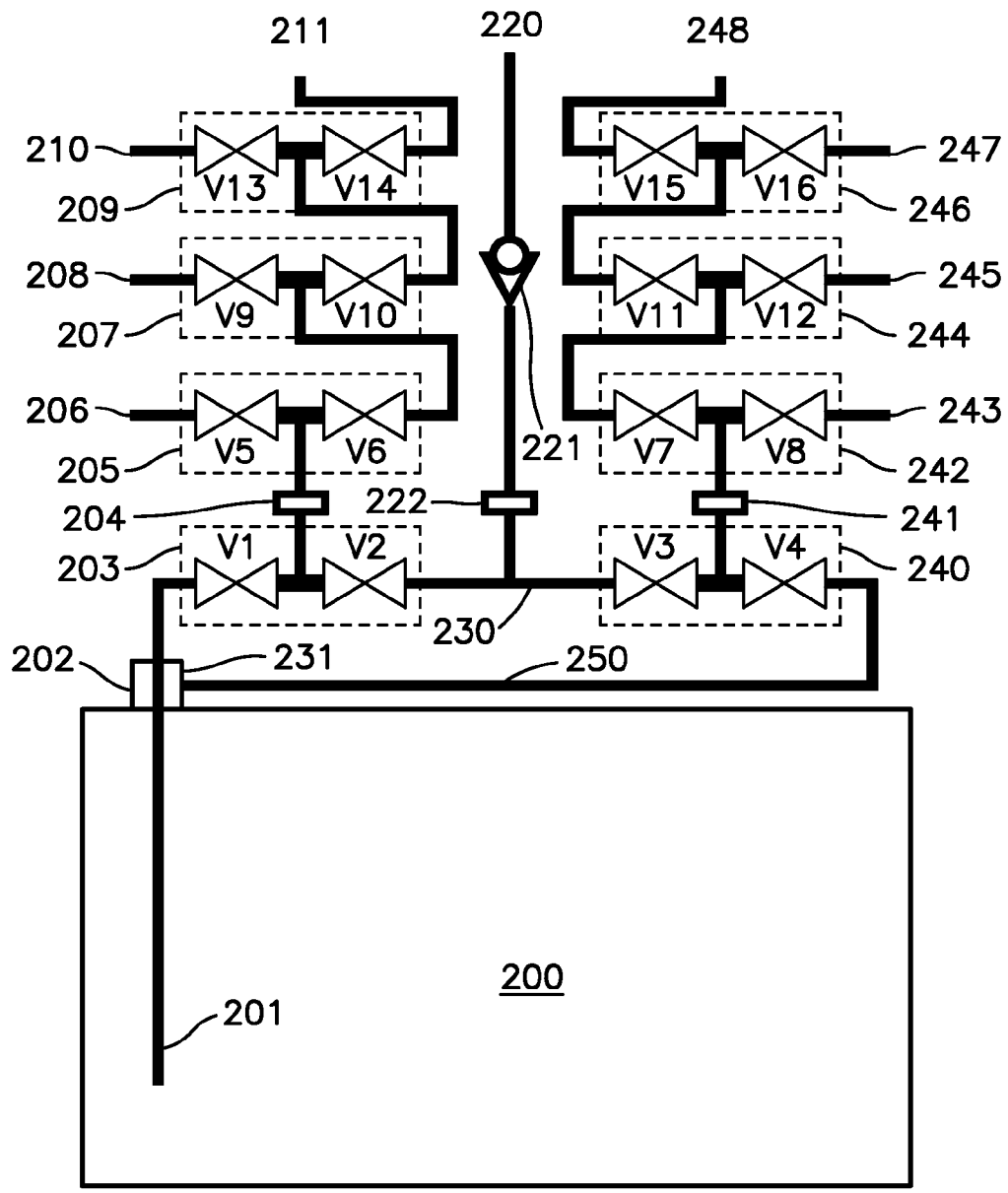
FIG. 14 is a schematic representation of a vapor or liquid phase reagent dispensing apparatus connected to a generic chemical delivery manifold, shown in cross-section.

The single port ampoule described in this invention may be hooked up to a complicated chemical delivery manifold as shown in FIG. 14. FIG. 14 is a schematic representation of a vapor or liquid phase reagent dispensing apparatus connected to a generic chemical delivery manifold, shown in cross-section. In FIG. 14, pairs of valves can be associated with single body, dual, opposing actuator multi-port block valves (203) which includes valves (V1) and (V2); (205) which includes valves (V5) and (V6); (207) which includes valves (V9) and (V10); (209) which includes valves (V13) and (V14); (240) which includes valves (V3) and (V4); (242) which includes valves (V7) and (V8); (244) which includes valves (V11) and (V12); and (246) which includes valves (V15) and (V16). Manifolds such as depicted in this FIG. 14 are disclosed, for example, in U.S. Pat. No. 6,648,034. When using container (200) in liquid delivery mode, push gas from conduit (243) can be delivered through block diaphragm valve assemblies (242) and (240), through tube (250) and to the annular inlet (231) of single port (202) to pressurize the headspace and push liquid chemical up dip-tube (201) (the inner tube of single port (202)) through block diaphragm valve assembly 203, through a low dead-space connector (204), through block diaphragm valve assembly (205) and to a chemical dispense conduit (206). In bubbler mode, a carrier gas is delivered through conduit (206), through block diaphragm valve assemblies (205) and (203), through the inner dip tube (201) of single port (202) where the gas bubbles through the chemical in container (200) to be removed as vapor through the annular outlet (231) of single port (202) and through block diaphragm valve assembly (240), low dead space connector (241), block diaphragm valve assembly (242) and out to conduit (243).

Depending on the desired functionality of the manifold shown in FIG. 14, it may have more or less block diaphragm valve assemblies than shown. For example, conduits (211), (210) and (208) may be connected to purge gas, solvent and bulk refill respectively with conduit (220) hooked to a waste line and (206) to the liquid vaporizer. To clean out the manifold for replacement the purge gas and solvent would be available through valves (V14) and (V13) respectively and could flush out (V2) through low dead-volume connector (222), check valve (221) and out to waste (220). A purge gas sweep followed by a solvent rinse and a purge gas dry would be an example of a clean cycle. Precursor refill could be accomplished by delivering precursor from bulk system on conduit (208), through valve (V9), block diaphragm valve assemblies (205) and (203) and into container (200) via the dip tube (201) in the single port (202).

The conduits (248), (247) and (245) and valve assemblies (246) and (244) on the non-dip tube side of the ampoule could have similar functionalities of purge, vacuum, solvent rinse depending on the desired functionality.

Various modifications and variations of this invention include the use of different materials of construction for the ampoules and adapters (e.g., copper, stainless steel, aluminum, nickel, Teflon, etc.); the use of different methods to join the fittings and valves (e.g., welding, machining, shrink fitting, etc.); the use of different valve styles (e.g., flat or contoured) and manufacturers (e.g., Parker, Hy-Tech, Swagelok, Fujikin, etc.); the use of different size valves and tubes (e.g., ⅛ inch, ¼ inch, ½ inch, etc.); the length of tube can be varied; the tube can optionally have holes along the length; and the tube may be modified along its length (i.e., non uniform cross-section).

As indicated above and referring to FIGS. 1, 5, 12, 13 and 14, this invention relates in part to a vapor phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving a carrier gas and dispensing a vapor phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a bubbler extends;

said bubbler comprising a tube that extends through a centrally located portion of said first port portion and through said inner gas volume into the source chemical and through which a carrier gas can be bubbled into the source chemical to cause at least a portion of source chemical vapor to become entrained in said carrier gas to produce a flow of vapor phase reagent to said inner gas volume above the fill level, said tube having an inlet end located generally vertically and exteriorly from said first port portion and an outlet end located generally adjacent to the vessel bottom wall member; and said first port portion having interstitial space between said tube and said port side wall member through which said vapor phase reagent can be dispensed from the inner gas volume of said vessel.

The vapor phase reagent dispensing apparatus further comprises the bubbler having a carrier gas feed inlet fitting connected thereto, and a carrier gas feed line extending from the carrier gas feed inlet fitting upwardly and exteriorly from the bubbler for delivery of carrier gas into the interior volume of the vessel, the carrier gas feed line containing a carrier gas flow control valve therein for control of flow of the carrier gas therethrough. The vapor phase reagent dispensing apparatus further comprises the third port portion having a vapor phase reagent outlet fitting connected thereto, and a vapor phase reagent discharge line extending from the vapor phase reagent outlet fitting upwardly and exteriorly from the third port portion for removal of vapor phase reagent from the interior volume of the vessel, the vapor phase reagent discharge line containing a vapor phase reagent flow control valve therein for control of flow of the vapor phase reagent therethrough.

The vapor phase reagent dispensing apparatus further comprises the vapor phase reagent discharge line in vapor phase reagent flow communication with a vapor phase delivery deposition system, said deposition system selected from a chemical vapor deposition system and an atomic layer deposition system.

As indicated above and referring to FIGS. 5, 6, 9, 10, 13 and 14, this invention also relates in part to a liquid phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving an inert gas and dispensing a liquid phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a diptube extends;

said diptube comprising a tube that extends through a centrally located portion of said first port portion and through said inner gas volume into the source chemical and through which liquid phase reagent can be dispensed from said apparatus, said diptube having an outlet end located generally vertically and exteriorly from said first port portion and an inlet end located generally adjacent to the vessel bottom wall member; and said first port portion having interstitial space between said tube and said port side wall member through which said inert gas can be fed to the inner gas volume above the fill level to pressurize the inner gas volume above the fill level.

The liquid phase reagent dispensing apparatus further comprises the third port portion having an inert gas feed inlet fitting connected thereto; and an inert gas feed line extending from the inert gas feed inlet fitting upwardly and exteriorly from the third port portion for delivery of inert gas into the interior volume of the vessel, the inert gas feed line containing an inert gas flow control valve therein for control of flow of the inert gas therethrough. The liquid phase reagent dispensing apparatus further comprises the diptube having a liquid phase reagent outlet fitting connected thereto; and a liquid phase reagent discharge line extending from the liquid phase reagent outlet fitting upwardly and exteriorly from said first port portion for removal of liquid phase reagent from the interior volume of the vessel, the liquid phase reagent discharge line optionally containing a liquid phase reagent flow control valve therein for control of flow of the liquid phase reagent therethrough.

The liquid phase reagent dispensing apparatus further comprises the liquid phase reagent discharge line in liquid phase reagent flow communication with a vaporization apparatus, said vaporization apparatus in vapor phase reagent flow communication with a vapor phase delivery deposition system, said deposition system selected from a chemical vapor deposition system and an atomic layer deposition system.

As indicated above and referring to FIGS. 7 and 8, this invention relates in part to a vapor phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said top wall member having a single port capable of receiving a carrier gas and dispensing a vapor phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a tube extends;

said tube extends through a centrally located portion of said first port portion into said inner gas volume and through which a carrier gas can be fed into said inner gas volume above the fill level to cause vapor of said source chemical to become entrained in said carrier gas to produce vapor phase reagent, said tube having an inlet end located generally vertically and exteriorly from said first port portion and an outlet end located in said inner gas volume; and said first port portion having interstitial space between said tube and said port side wall member through which said vapor phase reagent can be dispensed from the inner gas volume of said vessel.

The vapor phase reagent dispensing apparatus further comprises the tube having a carrier gas feed inlet fitting connected thereto, and a carrier gas feed line extending from the carrier gas feed inlet fitting upwardly and exteriorly from the tube for delivery of carrier gas into the interior volume of the vessel, the carrier gas feed line containing a carrier gas flow control valve therein for control of flow of the carrier gas therethrough. The vapor phase reagent dispensing apparatus further comprises the third port portion having a vapor phase reagent outlet fitting connected thereto, and a vapor phase reagent discharge line extending from the vapor phase reagent outlet fitting upwardly and exteriorly from the third port portion for removal of vapor phase reagent from the interior volume of the vessel, the vapor phase reagent discharge line containing a vapor phase reagent flow control valve therein for control of flow of the vapor phase reagent therethrough.

The vapor phase reagent dispensing apparatus further comprises the vapor phase reagent discharge line in vapor phase reagent flow communication with a vapor phase delivery deposition system, said deposition system selected from a chemical vapor deposition system and an atomic layer deposition system.

The vessel or ampoule is typically machined from stainless steel, e.g., 316L, and electropolished for ease of cleaning and to prevent contamination of the precursor liquid or solid source chemical. The cover or top wall member is optionally removable to facilitate cleaning and reuse. The vessel can comprise a cylindrically shaped side wall member or side wall members defining a non-cylindrical shape.

Fastening means are used to secure the fittings to the single port opening through the opposing surfaces. Suitable fastening means include, for example, engagement of a male nut or body hex with a female nut.

The containers must be fabricated using a material that does not react with the precursor. As indicated above, stainless steel is commonly selected as the material for constructing the precursor container. The tube would be composed of a similar material (e.g., stainless steel or nickel).

The ampoule can include inlet and outlet valves to allow the chemicals to be delivered to the end use equipment. Optional ampoule equipment include a fill port and a source chemical level sensor to determine when the ampoule is nearly empty. The material in the container is delivered either under vacuum, for low vapor pressure chemicals, or using an inert gas to sweep the vapors out. The material may alternatively be delivered as a liquid through a dip tube to the end use equipment where it can be vaporized or dispensed as needed.

A temperature sensor is preferably included in the ampoule to ensure uniform heat conduction. A source chemical level sensor is preferably included in the ampoule to ensure efficient use of the source chemical. The valves and source chemical level sensor are attached via face seal connections to ensure a clean, leak proof seal. Once assembled in a clean room, the ampoule is conditioned to remove adsorbed water and leak checked with a helium leak detector. The ampoule is designed to be used at pressures from a few torr to slightly above ambient.

In an embodiment of this invention, the temperature sensor extends from an upper end exterior of the vessel through a portion of the top wall member and generally vertically downwardly into the interior volume of the vessel, with the lower end of the temperature sensor being located in non-interfering proximity to the surface of the bottom wall. The source chemical level sensor extends from an upper end exterior of the vessel through a portion of the top wall member and generally vertically downwardly into the interior volume of the vessel, with the lower end of the source chemical level sensor being located in non-interfering proximity to the surface of the bottom wall. The temperature sensor is operatively arranged in the vessel to determine the temperature of source chemical in the vessel, the source chemical level sensor is operatively arranged in the vessel to determine the level of source chemical in the vessel, the temperature sensor and source chemical level sensor are located in non-interfering proximity to each other in the vessel, with the lower end of the temperature sensor being located at the same or closer proximity to the surface of the vessel in relation to the lower end of the source chemical level sensor, and the temperature sensor and source chemical level sensor are in source chemical flow communication in the vessel. The source chemical level sensor is selected from ultrasonic sensors, optical sensors, capacitive sensors and float-type sensors, and said temperature sensor comprises a thermowell and thermocouple.

In an embodiment of this invention, the bottom wall member provides a sump cavity in which the lower end of a temperature sensor, source chemical level sensor, dip tube and/or bubbler tube may be disposed. Such a configuration can permit a high percentage, e.g., 95% or greater, preferably 98% or greater, of the volume of the originally furnished liquid or solid source chemical to be utilized in the application for which the source chemical is selectively dispensed. This configuration can also improve the economics of the source chemical supply and dispensing system and processes in which the dispensed source chemical is employed.

This invention allows for a minimal amount of semiconductor precursor chemical to remain in the ampoule or bubbler when the source chemical level sensor has signaled the end of the contents. This is very important as the complexity and cost of semiconductor precursors rises. In order to minimize costs, semiconductor manufacturers will want to waste as little precursor as possible. In addition, this invention places the temperature sensor in the same recessed sump cavity as the source chemical level sensor. This ensures that the true temperature of the source chemical semiconductor precursor will be read as long as the source chemical level sensor indicates there is precursor present. This is important from a safety standpoint. If the temperature sensor was to be outside of the semiconductor precursor it would send a false low temperature signal to the heating apparatus. This could lead to the application of excessive heat to the ampoule which can cause an unsafe situation and decomposition of the semiconductor precursor.

Referring again to the vessel or ampoule, the vessel can be equipped with a source chemical level sensor which extends from an upper portion exterior of the vessel, downwardly through a non-centrally located portion of the top wall member of the vessel, to a lower end, non-centrally located on the bottom floor member, in close proximity to the surface of the sump cavity of the vessel to permit utilization of at least 95% of source chemical reagent when source chemical reagent is contained in the vessel. The upper portion of the source chemical level sensor may be connected by a source chemical level sensing signal transmission line to a central processing unit, for transmission of sensed source chemical level signals from the source chemical level sensor to the central processing unit during operation of the system.

In a like manner, the vessel can be equipped with a temperature sensor, i.e., a thermowell and thermocouple, which extends from an upper portion exterior of the vessel, downwardly through a centrally located portion of the top wall member of the vessel, to a lower end, centrally located on the bottom wall member, in close proximity to the surface of the sump cavity of the vessel. The upper portion of the temperature sensor may be connected by a temperature sensing signal transmission line to a central processing unit, for transmission of sensed temperature signals from the temperature sensor to the central processing unit during operation of the system.

The central processing unit, which may comprise a suitable microprocessor, computer, or other appropriate control means, may also be joined by a control signal transmission line to a flow control valve (e.g., via a suitable valve actuator element) to selectively adjust flow control valve and control the flow of carrier gas to the vessel. The central processing unit may also be joined by a control signal transmission line to a second flow control valve (e.g., via a suitable valve actuator element) to selectively adjust the flow control valve and control the discharge of vapor or liquid phase reagent from the vessel. For purposes of this invention, flow control valves shall include isolation valves, metering valves and the like.

This invention allows the semiconductor manufacturer to use the maximum amount of precursor while wasting very little before change-out of the ampoule. This minimizes waste and maximizes the return on the investment in the semiconductor precursor and specific application.

The source chemicals useful in this invention can vary over a wide range and include, for example, liquid or solid precursors for a metal selected from Group 2, Group 3, Group 4, Group 5, Group 6, Group 7, Group 8, Group 9, Group 10, Group 11, Group 12, Group 13, Group 14, Group 15, Group 16, and the Lanthanide series of the Periodic Table. Illustrative source chemicals include, for example, liquid or solid precursors for a metal selected from ruthenium, hafnium, tantalum, molybdenum, platinum, gold, titanium, lead, palladium, zirconium, bismuth, strontium, barium, calcium, antimony and thallium, or precursor for a metalloid selected from silicon, germanium and tellurium. Preferred organometallic precursor compounds include ruthenium-containing, hafnium-containing, tantalum-containing and/or molybdenum-containing organometallic precursor compounds.

Solid source chemicals that sublime and solid source chemicals that melt upon heating can be used in this invention. For example, solid source chemicals that sublime can be used in the vapor phase reagent dispensing apparatus shown in FIG. 1. Solid source chemicals that melt upon heating can be used in the vapor phase reagent dispensing apparatus shown in FIG. 1 and the liquid phase reagent dispensing apparatus shown in FIG. 1. Likewise, liquid source chemicals can be used in the vapor phase reagent dispensing apparatus shown in FIG. 1 and the liquid phase reagent dispensing apparatus shown in FIG. 1. When using solid source chemicals that sublime, it may be necessary to employ dust entrapment equipment.

The vapor or liquid phase reagents useful in this invention can vary over a wide range and include, for example, liquid or solid precursors for a metal selected from Group 2, Group 3, Group 4, Group 5, Group 6, Group 7, Group 8, Group 9, Group 10, Group 11, Group 12, Group 13, Group 14, Group 15, Group 16, and the Lanthanide series of the Periodic Table. Illustrative precursors include, for example, precursors for a metal selected from ruthenium, hafnium, tantalum, molybdenum, platinum, gold, titanium, lead, palladium, zirconium, bismuth, strontium, barium, calcium, antimony and thallium, or precursor for a metalloid selected from silicon, germanium and tellurium. Preferred organometallic precursor compounds include ruthenium-containing, hafnium-containing, tantalum-containing and/or molybdenum-containing organometallic precursor compounds.

The vapor phase reagent dispensing apparatus can further comprise a carrier gas source coupled to the carrier gas feed line. Likewise, the liquid phase reagent dispensing apparatus can further comprise an inert gas source coupled to the inert gas feed line.

Referring to FIGS. 1, 5, 12, 13 and 14, the vapor phase reagent dispensing apparatus can further comprise:

a deposition chamber selected from a chemical vapor deposition chamber or an atomic layer deposition chamber;

the vapor phase reagent discharge line connecting the vapor phase reagent dispensing apparatus to the deposition chamber;

optionally a heatable susceptor contained within the deposition chamber and located in a receiving relationship to the vapor phase reagent discharge line; and an effluent discharge line connected to the deposition chamber;

such that vapor phase reagent passes through the vapor phase reagent discharge line and into the deposition chamber, for contact with a substrate, optionally on the heatable susceptor, and any remaining effluent is discharged through the effluent discharge line.

The substrate is comprised of a material selected from a metal, a metal silicide, a metal carbide, a metal nitride, a semiconductor, an insulator and a barrier material. The substrate is preferably a patterned wafer.

Referring to FIGS. 5, 6, 9, 10, 13 and 14, the liquid phase reagent dispensing apparatus can further comprise:

a deposition chamber selected from a chemical vapor deposition chamber and an atomic layer deposition chamber;

the liquid phase reagent discharge line connecting the liquid phase reagent dispensing apparatus to a vaporization apparatus;

a portion of the vaporization apparatus having a carrier gas feed inlet opening through which carrier gas can be fed into said vaporization apparatus to cause vapor of said liquid phase reagent to become entrained in said carrier gas to produce vapor phase reagent;

a portion of the vaporization apparatus having a vapor phase reagent outlet opening through which said vapor phase reagent can be dispensed from said vaporization apparatus;

a carrier gas feed line extending from the carrier gas feed inlet opening exteriorly from the vaporization apparatus for delivery of carrier gas into said vaporization apparatus, the carrier gas feed line containing a carrier gas flow control valve therein for control of flow of the carrier gas therethrough;

a vapor phase reagent discharge line extending from the vapor phase reagent outlet opening exteriorly from the vaporization apparatus for removal of vapor phase reagent from said vaporization apparatus to said deposition chamber, the vapor phase reagent discharge line containing a vapor phase reagent flow control valve therein for control of flow of the vapor phase reagent therethrough;

optionally a heatable susceptor contained within the deposition chamber and located in a receiving relationship to the vaporization apparatus; and an effluent discharge line connected to the deposition chamber;

such that vapor phase reagent passes through the vapor phase reagent discharge line and into the deposition chamber, for contact with a substrate, optionally on the heatable susceptor, and any remaining effluent is discharged through the effluent discharge line.

The substrate is comprised of a material selected from a metal, a metal silicide, a metal carbide, a metal nitride, a semiconductor, an insulator and a barrier material. The substrate is preferably a patterned wafer.

Referring to FIGS. 7 and 8, the vapor phase reagent dispensing apparatus can further comprise:

a deposition chamber selected from a chemical vapor deposition chamber or an atomic layer deposition chamber;

the vapor phase reagent discharge line connecting the vapor phase reagent dispensing apparatus to the deposition chamber;

optionally a heatable susceptor contained within the deposition chamber and located in a receiving relationship to the vapor phase reagent discharge line; and an effluent discharge line connected to the deposition chamber;

such that vapor phase reagent passes through the vapor phase reagent discharge line and into the deposition chamber, for contact with a substrate, optionally on the heatable susceptor, and any remaining effluent is discharged through the effluent discharge line.

The substrate is comprised of a material selected from a metal, a metal silicide, a metal carbide, a metal nitride, a semiconductor, an insulator and a barrier material. The substrate is preferably a patterned wafer.

As indicated above, this invention relates to a method for delivery of a vapor phase reagent to a deposition chamber comprising:

(a) providing a vapor phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving a carrier gas and dispensing a vapor phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a bubbler extends;

said bubbler comprising a tube that extends through a centrally located portion of said first port portion and through said inner gas volume into the source chemical and through which a carrier gas can be bubbled into the source chemical to cause at least a portion of source chemical vapor to become entrained in said carrier gas to produce a flow of vapor phase reagent to said inner gas volume above the fill level, said tube having an inlet end located generally vertically and exteriorly from said first port portion and an outlet end located generally adjacent to the vessel bottom wall member;

said first port portion having interstitial space between said tube and said port side wall member through which said vapor phase reagent can be dispensed from the inner gas volume of said vessel;

said bubbler having a carrier gas feed inlet fitting connected thereto;

a carrier gas feed line extending from the carrier gas feed inlet fitting upwardly and exteriorly from the bubbler for delivery of carrier gas into the interior volume of the vessel, the carrier gas feed line containing a carrier gas flow control valve therein for control of flow of the carrier gas therethrough;

said third port portion having a vapor phase reagent outlet fitting connected thereto; and a vapor phase reagent discharge line extending from the vapor phase reagent outlet fitting upwardly and exteriorly from the third port portion for removal of vapor phase reagent from the interior volume of the vessel, the vapor phase reagent discharge line containing a vapor phase reagent flow control valve therein for control of flow of the vapor phase reagent therethrough;

(b) adding source chemical to said vapor phase reagent dispensing apparatus;

(c) heating the source chemical in said vapor phase reagent dispensing apparatus to a temperature sufficient to vaporize the source chemical to provide vapor phase reagent;

(d) feeding a carrier gas into said vapor phase reagent dispensing apparatus through said carrier gas feed line and said tube;

(e) withdrawing the vapor phase reagent and carrier gas from said vapor phase reagent dispensing apparatus through said vapor phase reagent discharge line; and (f) feeding the vapor phase reagent and carrier gas into said deposition chamber.

The method can further comprise:

(g) contacting the vapor phase reagent with a substrate, optionally on a heatable susceptor, within the deposition chamber; and (h) discharging any remaining effluent through an effluent discharge line connected to the deposition chamber. The deposition chamber can be selected from a chemical vapor deposition chamber and an atomic layer deposition chamber.

In operation of the system described above, source chemical is placed in the vessel and heated to a temperature sufficient to vaporize the source chemical. Carrier gas is allowed to flow through the carrier gas feed line to the carrier gas feed inlet opening and through bubbler tube from which it is bubbled into the source chemical. A carrier gas flow control valve controls the flow of the carrier gas that is discharged into the source chemical. Vapor from the source chemical becomes entrained in the carrier gas to produce vapor phase reagent.

The vapor phase reagent is discharged from the inner gas volume through the vapor phase reagent outlet opening and the vapor phase reagent discharge line. The vapor phase reagent is flowed in the vapor phase reagent discharge line to the deposition chamber. A vapor phase reagent flow control valve controls the flow of the vapor phase reagent that is flowed to the deposition chamber. In the deposition chamber, the vapor phase reagent is deposited onto the wafer or other substrate element that is mounted on a heatable substrate or other mount structure. Effluent vapor from the deposition chamber is discharged in effluent discharge line. The effluent may be passed to recycle, recovery, waste treatment, disposal, or other disposition means.

During this operation, the source chemical fill level in the vessel is detected by a source chemical level sensor. It is important to know when the liquid precursor chemical inside of the vessel is close to running out so that it can be changed at the end of a chemical vapor deposition or atomic layer deposition process. The source chemical level progressively declines and eventually lowers into the sump cavity to a minimum liquid head (height of liquid in the sump cavity), at which point the central processing unit receives a corresponding sensed source chemical level signal by a source chemical level sensing signal transmission line. The central processing unit responsively transmits a control signal in a control signal transmission line to the carrier gas flow control valve to close the valve and shut off the flow of carrier gas to the vessel, and also concurrently transmits a control signal in a control signal transmission line to close the vapor phase reagent flow control valve, to shut off the flow of vapor phase reagent from the vessel.

Also, during this operation, the temperature of the source chemical in vessel is detected by a temperature sensor. It is important to monitor the temperature of the liquid precursor chemical inside of the vessel to control the vapor pressure. If the temperature of the source chemical in the vessel becomes too high or too low, the central processing unit receives a corresponding sensed temperature signal by a temperature sensing signal transmission line. The central processing unit responsively transmits a control signal in a control signal transmission line to a heating means to decrease or increase the temperature as required.

The vapor phase reagent dispensing apparatus, e.g., bubbler, of this invention may be useful for vaporization of liquids and solid materials, e.g., liquid and solid source reagents used in chemical vapor deposition, atomic layer deposition and ion implantation processes. See, for example, U.S. Pat. No. 7,077,388 B2.

As indicated above, this invention relates in part to a method for delivery of a vapor phase reagent to a deposition chamber comprising:

(a) providing a liquid phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving an inert gas and dispensing a liquid phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a diptube extends;

said diptube comprising a tube that extends through a centrally located portion of said first port portion and through said inner gas volume into the source chemical and through which liquid phase reagent can be dispensed from said apparatus, said diptube having an outlet end located generally vertically and exteriorly from said first port portion and an inlet end located generally adjacent to the vessel bottom wall member;

said first port portion having interstitial space between said tube and said port side wall member through which said inert gas can be fed to the inner gas volume above the fill level to pressurize the inner gas volume above the fill level; said third port portion having an inert gas feed inlet fitting connected thereto;

an inert gas feed line extending from the inert gas feed inlet fitting upwardly and exteriorly from the third port portion for delivery of inert gas into the interior volume of the vessel, the inert gas feed line containing an inert gas flow control valve therein for control of flow of the inert gas therethrough;

said diptube having a liquid phase reagent outlet fitting connected thereto; and a liquid phase reagent discharge line extending from the liquid phase reagent outlet fitting upwardly and exteriorly from the first port portion for removal of liquid phase reagent from the interior volume of the vessel, the liquid phase reagent discharge line optionally containing a liquid phase reagent flow control valve therein for control of flow of the liquid phase reagent therethrough;

(b) adding liquid phase reagent to said liquid phase reagent dispensing apparatus;

(c) optionally heating a solid source chemical in said liquid phase reagent dispensing apparatus to a temperature sufficient to melt the solid source chemical to provide liquid phase reagent;

(d) feeding an inert gas into said liquid phase reagent dispensing apparatus through said inert gas feed line;

(e) withdrawing the liquid phase reagent from said liquid phase reagent dispensing apparatus through said tube and said liquid phase reagent discharge line;

(f) providing a vaporization apparatus comprising:

a vessel configured to form an internal vessel compartment to vaporize the liquid phase reagent;

said liquid phase reagent discharge line connecting the liquid phase reagent dispensing apparatus to said vaporization apparatus;

a portion of the vaporization apparatus having a carrier gas feed inlet opening through which carrier gas can be fed into said vaporization apparatus to cause vapor of said liquid phase reagent to become entrained in said carrier gas to produce vapor phase reagent;

a portion of the vaporization apparatus having a vapor phase reagent outlet opening through which said vapor phase reagent can be dispensed from said vaporization apparatus;

a carrier gas feed line extending from the carrier gas feed inlet opening exteriorly from the vaporization apparatus for delivery of carrier gas into said vaporization apparatus, the carrier gas feed line containing one or more carrier gas flow control valves therein for control of flow of the carrier gas therethrough; and a vapor phase reagent discharge line extending from the vapor phase reagent outlet opening exteriorly from the vaporization apparatus for removal of vapor phase reagent from said vaporization apparatus to said deposition chamber, the vapor phase reagent discharge line optionally containing one or more vapor phase reagent flow control valves therein for control of flow of the vapor phase reagent therethrough;

(g) feeding the liquid phase reagent into said vaporization apparatus;

(h) heating the liquid phase reagent in said vaporization apparatus to a temperature sufficient to vaporize the liquid phase reagent to provide said vapor phase reagent;

(i) feeding a carrier gas into said vaporization apparatus through said carrier gas feed line;

(j) withdrawing the vapor phase reagent and carrier gas from said vaporization apparatus through said vapor phase reagent discharge line; and (k) feeding the vapor phase reagent and carrier gas into said deposition chamber.

The method can further comprise:

(l) contacting the vapor phase reagent with a substrate, optionally on a heatable susceptor, within the deposition chamber; and (m) discharging any remaining effluent through an effluent discharge line connected to the deposition chamber. The deposition chamber can be selected from a chemical vapor deposition chamber and an atomic layer deposition chamber.

In operation of the system described above, source chemical is placed in the vessel and an inert gas is allowed to flow through the inert gas feed line to the inert gas feed inlet opening and into the inner gas volume above the fill level to pressurize the inner gas volume above the fill level. An inert gas flow control valve controls the flow of the inert gas that is discharged into the inner gas volume above the fill level.

The liquid phase reagent is discharged from the vessel through liquid phase reagent outlet opening (e.g., dip tube) and the liquid phase reagent discharge line. The liquid phase reagent is flowed in the liquid phase reagent discharge line to the vaporization apparatus. A liquid phase reagent flow control valve controls the flow of the liquid phase reagent that is flowed to the vaporization apparatus.

In vaporization apparatus, the liquid phase reagent is vaporized to form a source vapor for the subsequent vapor deposition operation. The vaporization apparatus may also receive a carrier gas for combining with or shrouding the source vapor produced by vaporization of the liquid phase reagent. Alternatively, the source vapor may be passed to the downstream vapor deposition operation in neat form. In any event, the source vapor from vaporization apparatus is flowed through vapor phase reagent discharge line to deposition chamber. In the deposition chamber, the vapor phase reagent is deposited onto the wafer or other substrate element that is mounted on a heatable substrate or other mount structure. Effluent vapor from the deposition chamber is discharged in effluent discharge line. The effluent may be passed to recycle, recovery, waste treatment, disposal, or other disposition means.

During this operation, the source chemical fill level in the vessel is detected by a source chemical level sensor. It is important to know when the liquid precursor chemical inside of the vessel is close to running out so that it can be changed at the end of a chemical vapor deposition or atomic layer deposition process.

The source chemical level progressively declines and eventually lowers into the sump cavity to a minimum liquid head (height of liquid in the sump cavity), at which point the central processing unit receives a corresponding sensed source chemical level signal by a source chemical level sensing signal transmission line. The central processing unit responsively transmits a control signal in a control signal transmission line to the carrier gas flow control valve to close the valve and shut off the flow of carrier gas to the vessel, and also concurrently transmits a control signal in a control signal transmission line to close the liquid phase reagent flow control valve, to shut off the flow of liquid reagent from the vessel.

Also, during this operation, the temperature of the source chemical in vessel is detected by a temperature sensor. It is important to monitor the temperature of the liquid precursor chemical inside of the vessel to control the vapor pressure. If the temperature of the source chemical in the vessel becomes too high or too low, the central processing unit receives a corresponding sensed temperature signal by a temperature sensing signal transmission line. The central processing unit responsively transmits a control signal in a control signal transmission line to a heating means to decrease or increase the temperature as required.

The liquid phase reagent dispensing apparatus of this invention may be useful for dispensing of reagents such as precursors used in chemical vapor deposition, atomic layer deposition and ion implantation processes, and can achieve a high level of withdrawal of liquid reagent from the vessel. See, for example, U.S. Pat. No. 6,077,356.

In another embodiment, this invention relates in part to a method for delivery of a vapor phase reagent to a deposition chamber comprising:

(a) providing a vapor phase reagent dispensing apparatus comprising: a vessel which comprises a vessel top wall member, a vessel side wall member and a vessel bottom wall member configured to form an internal vessel compartment to hold a source chemical up to a fill level and to additionally define an inner gas volume above the fill level;

said top wall member having a single port capable of receiving a carrier gas and dispensing a vapor phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a tube extends;

said tube extends through a centrally located portion of said first port portion into said inner gas volume and through which a carrier gas can be fed into said inner gas volume above the fill level to cause vapor of said source chemical to become entrained in said carrier gas to produce vapor phase reagent, said tube having an inlet end located generally vertically and exteriorly from said first port portion and an outlet end located in said inner gas volume;

said first port portion having interstitial space between said tube and said port side wall member through which said vapor phase reagent can be dispensed from the inner gas volume of said vessel;

said tube having a carrier gas feed inlet fitting connected thereto;

a carrier gas feed line extending from the carrier gas feed inlet fitting upwardly and exteriorly from the tube for delivery of carrier gas into the interior volume of the vessel, the carrier gas feed line containing a carrier gas flow control valve therein for control of flow of the carrier gas therethrough;

said third port portion having a vapor phase reagent outlet fitting connected thereto; and a vapor phase reagent discharge line extending from the vapor phase reagent outlet fitting upwardly and exteriorly from the third port portion for removal of vapor phase reagent from the interior volume of the vessel, the vapor phase reagent discharge line containing a vapor phase reagent flow control valve therein for control of flow of the vapor phase reagent therethrough;

(b) adding source chemical to said vapor phase reagent dispensing apparatus;

(c) heating the source chemical in said vapor phase reagent dispensing apparatus to a temperature sufficient to vaporize the source chemical to provide vapor phase reagent;

(d) feeding a carrier gas into said vapor phase reagent dispensing apparatus through said carrier gas feed line and said tube;

(e) withdrawing the vapor phase reagent and carrier gas from said vapor phase reagent dispensing apparatus through said vapor phase reagent discharge line; and (f) feeding the vapor phase reagent and carrier gas into said deposition chamber.

The method can further comprise:

(g) contacting the vapor phase reagent with a substrate, optionally on a heatable susceptor, within the deposition chamber; and (h) discharging any remaining effluent through an effluent discharge line connected to the deposition chamber. The deposition chamber can be selected from a chemical vapor deposition chamber and an atomic layer deposition chamber.

In operation of the system described above, source chemical is placed in the vessel and heated to a temperature sufficient to vaporize the source chemical. Carrier gas is allowed to flow through the carrier gas feed line to the carrier gas feed inlet opening and through bubbler tube from which it is bubbled into the source chemical. A carrier gas flow control valve controls the flow of the carrier gas that is discharged into the source chemical. Vapor from the source chemical becomes entrained in the carrier gas to produce vapor phase reagent.

The vapor phase reagent is discharged from the inner gas volume through the vapor phase reagent outlet opening and the vapor phase reagent discharge line.

The vapor phase reagent is flowed in the vapor phase reagent discharge line to the deposition chamber. A vapor phase reagent flow control valve controls the flow of the vapor phase reagent that is flowed to the deposition chamber. In the deposition chamber, the vapor phase reagent is deposited onto the wafer or other substrate element that is mounted on a heatable substrate or other mount structure. Effluent vapor from the deposition chamber is discharged in effluent discharge line. The effluent may be passed to recycle, recovery, waste treatment, disposal, or other disposition means.

During this operation, the source chemical fill level in the vessel is detected by a source chemical level sensor. It is important to know when the liquid precursor chemical inside of the vessel is close to running out so that it can be changed at the end of a chemical vapor deposition or atomic layer deposition process. The source chemical level progressively declines and eventually lowers into the sump cavity to a minimum liquid head (height of liquid in the sump cavity), at which point the central processing unit receives a corresponding sensed source chemical level signal by a source chemical level sensing signal transmission line. The central processing unit responsively transmits a control signal in a control signal transmission line to the carrier gas flow control valve to close the valve and shut off the flow of carrier gas to the vessel, and also concurrently transmits a control signal in a control signal transmission line to close the vapor phase reagent flow control valve, to shut off the flow of vapor phase reagent from the vessel.

Also, during this operation, the temperature of the source chemical in vessel is detected by a temperature sensor. It is important to monitor the temperature of the liquid precursor chemical inside of the vessel to control the vapor pressure. If the temperature of the source chemical in the vessel becomes too high or too low, the central processing unit receives a corresponding sensed temperature signal by a temperature sensing signal transmission line. The central processing unit responsively transmits a control signal in a control signal transmission line to a heating means to decrease or increase the temperature as required.

The vapor phase reagent dispensing apparatus, e.g., bubbler, of this invention may be useful for vaporization of liquids and solid materials, e.g., liquid and solid source reagents used in chemical vapor deposition, atomic layer deposition and ion implantation processes. See, for example, U.S. Pat. No. 7,077,388 B2.

In an embodiment of this invention, an organometallic compound is employed in vapor phase deposition techniques for forming powders, films or coatings. The compound can be employed as a single source precursor or can be used together with one or more other precursors, for instance, with vapor generated by heating at least one other organometallic compound or metal complex.

Deposition can be conducted in the presence of other vapor phase components. In an embodiment of the invention, film deposition is conducted in the presence of at least one non-reactive carrier gas. Examples of non-reactive gases include inert gases, e.g., nitrogen, argon, helium, as well as other gases that do not react with the organometallic compound precursor under process conditions. In other embodiments, film deposition is conducted in the presence of at least one reactive gas. Some of the reactive gases that can be employed include but are not limited to hydrazine, oxygen, hydrogen, air, oxygen-enriched air, ozone ($O_3$), nitrous oxide ($N_2O$), water vapor, organic vapors, ammonia and others. As known in the art, the presence of an oxidizing gas, such as, for example, air, oxygen, oxygen-enriched air, $O_3$, $N_2O$ or a vapor of an oxidizing organic compound, favors the formation of a metal oxide film.

Deposition methods described herein can be conducted to form a film, powder or coating that includes a single metal or a film, powder or coating that includes a single metal oxide. Mixed films, powders or coatings also can be deposited, for instance mixed metal oxide films. A mixed metal oxide film can be formed, for example, by employing several organometallic precursors, at least one of which being selected from the organometallic compounds described above.

Vapor phase film deposition can be conducted to form film layers of a desired thickness, for example, in the range of from less than 1 nm to over 1 mm. The precursors described herein are particularly useful for producing thin films, e.g., films having a thickness in the range of from about 1 nm to about 100 nm. Films of this invention, for instance, can be considered for fabricating metal electrodes, in particular as n-channel metal electrodes in logic, as capacitor electrodes for DRAM applications, and as dielectric materials.

The deposition method also is suited for preparing layered films, wherein at least two of the layers differ in phase or composition. Examples of layered film include metal-insulator-semiconductor, and metal-insulator-metal.

The organometallic compound precursors can be employed in atomic layer deposition, chemical vapor deposition or, more specifically, in metalorganic chemical vapor deposition processes known in the art. For instance, the organometallic compound precursors described above can be used in atmospheric, as well as in low pressure, chemical vapor deposition processes. The compounds can be employed in hot wall chemical vapor deposition, a method in which the entire reaction chamber is heated, as well as in cold or warm wall type chemical vapor deposition, a technique in which only the substrate is being heated.

The organometallic compound precursors described above also can be used in plasma or photo-assisted chemical vapor deposition processes, in which the energy from a plasma or electromagnetic energy, respectively, is used to activate the chemical vapor deposition precursor. The compounds also can be employed in ion-beam, electron-beam assisted chemical vapor deposition processes in which, respectively, an ion beam or electron beam is directed to the substrate to supply energy for decomposing a chemical vapor deposition precursor. Laser-assisted chemical vapor deposition processes, in which laser light is directed to the substrate to affect photolytic reactions of the chemical vapor deposition precursor, also can be used.

The deposition method can be conducted in various chemical vapor deposition reactors, such as, for instance, hot or cold-wall reactors, plasma-assisted, beam-assisted or laser-assisted reactors, as known in the art.

Illustrative substrates useful in the deposition chamber include, for example, materials selected from a metal, a metal silicide, a semiconductor, an insulator and a barrier material. A preferred substrate is a patterned wafer. Examples of substrates that can be coated employing the deposition method include solid substrates such as metal substrates, e.g., Al, Ni, Ti, Co, Pt, Ta; metal silicides, e.g., $TiSi_2$, $CoSi_2$, $NiSi_2$; semiconductor materials, e.g., Si, SiGe, GaAs, InP, diamond, GaN, SiC; insulators, e.g., $SiO_2$, $Si_3N_4$, $HfO_2$, $Ta_2O_5$, $Al_2O_3$, barium strontium titanate (BST); barrier materials, e.g., TiN, TaN; or on substrates that include combinations of materials. In addition, films or coatings can be formed on glass, ceramics, plastics, thermoset polymeric materials, and on other coatings or film layers. In a preferred embodiment, film deposition is on a substrate used in the manufacture or processing of electronic components. In other embodiments, a substrate is employed to support a low resistivity conductor deposit that is stable in the presence of an oxidizer at high temperature or an optically transmitting film.

The deposition method can be conducted to deposit a film on a substrate that has a smooth, flat surface. In an embodiment, the method is conducted to deposit a film on a substrate used in wafer manufacturing or processing. For instance, the method can be conducted to deposit a film on patterned substrates that include features such as trenches, holes or vias. Furthermore, the deposition method also can be integrated with other steps in wafer manufacturing or processing, e.g., masking, etching and others.

Chemical vapor deposition films can be deposited to a desired thickness. For example, films formed can be less than 1 micron thick, preferably less than 500 nanometers and more preferably less than 200 nanometers thick. Films that are less than 50 nanometers thick, for instance, films that have a thickness between about 0.1 and about 20 nanometers, also can be produced.

Organometallic compound precursors described above also can be employed in the method of the invention to form films by atomic layer deposition or atomic layer nucleation techniques, during which a substrate is exposed to alternate pulses of precursor, oxidizer and inert gas streams. Sequential layer deposition techniques are described, for example, in U.S. Pat. No. 6,287,965 and in U.S. Pat. No. 6,342,277. The disclosures of both patents are incorporated herein by reference in their entirety.

For example, in one atomic layer deposition cycle, a substrate is exposed, in step-wise manner, to: a) an inert gas; b) inert gas carrying precursor vapor; c) inert gas; and d) oxidizer, alone or together with inert gas. In general, each step can be as short as the equipment will permit (e.g. milliseconds) and as long as the process requires (e.g. several seconds or minutes). The duration of one cycle can be as short as milliseconds and as long as minutes. The cycle is repeated over a period that can range from a few minutes to hours. Film produced can be a few nanometers thin or thicker, e.g., 1 millimeter (mm).

The means and method of this invention thus achieves a substantial advance in the art, in the provision of a system for supply and dispensing of a vapor or liquid phase reagent, which permits 95-98% of the volume of the originally furnished source chemical to be utilized in the application for which the vapor or liquid phase reagent is selectively dispensed. The ease of cleaning of the two-part ampoule allows for re-use of these ampoules beyond what may be attained with the one-part ampoules.

Correspondingly, in operations such as the manufacture of semiconductor and superconductor products, it is possible with the means and method of this invention to reduce the waste of the source chemical to levels as low as 2-5% of the volume originally loaded into the dispensing vessel, and to re-use the ampoules many times over.

Accordingly, the practice of this invention markedly improves the economics of the source chemical supply and vapor or liquid phase reagent dispensing system, and the process in which the dispensed vapor or liquid phase reagent is employed. The invention in some instances may permit the cost-effective utilization of source chemicals which were as a practical matter precluded by the waste levels characteristic of prior art practice.

Various modifications and variations of this invention will be obvious to a worker skilled in the art and it is to be understood that such modifications and variations are to be included within the purview of this application and the spirit and scope of the claims.

The invention claimed is:

1. A vapor phase reagent dispensing apparatus comprising:
   a vessel which comprises a vessel top wall member, a vessel side wall member and a vessel bottom wall member configured to form an internal vessel compartment to hold a source chemical up to a fill level and to additionally define an inner gas volume above the fill level;
   said vessel top wall member having a single port capable of receiving a carrier gas and dispensing a vapor phase reagent;
   said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;
   said first port portion having a port top wall member and a port side wall member, said port top wall member having an opening through which a bubbler extends;
   said bubbler comprising a tube that extends through a centrally located portion of said first port portion and through said inner gas volume into the source chemical and through which a carrier gas can be bubbled into the source chemical to cause at least a portion of source chemical vapor to become entrained in said carrier gas to produce a flow of vapor phase reagent to said inner gas volume above the fill level, said tube having an inlet end located generally vertically and exteriorly from said first port portion and an outlet end located generally adjacent to the vessel bottom wall member; and
   said first port portion having interstitial space between said tube and said port side wall member through which said vapor phase reagent can be dispensed from the inner gas volume of said vessel.

2. The vapor phase reagent dispensing apparatus of claim 1 further comprising:
   said bubbler having a carrier gas feed inlet fitting connected thereto;
   a carrier gas feed line extending from the carrier gas feed inlet fitting upwardly and exteriorly from the bubbler for delivery of carrier gas into the interior volume of the vessel, the carrier gas feed line containing a carrier gas flow control valve therein for control of flow of the carrier gas therethrough;
   said third port portion having a vapor phase reagent outlet fitting connected thereto; and
   a vapor phase reagent discharge line extending from the vapor phase reagent outlet fitting upwardly and exteriorly from the third port portion for removal of vapor phase reagent from the interior volume of the vessel, the vapor phase reagent discharge line containing a vapor phase reagent flow control valve therein for control of flow of the vapor phase reagent therethrough.

3. The vapor phase reagent dispensing apparatus of claim 1 in which said vessel bottom wall member has a sump cavity therein extending downwardly from the surface of said vessel bottom wall member.

4. The vapor phase reagent dispensing apparatus of claim 1 further comprising a carrier gas source coupled to the carrier gas feed line.

5. The vapor phase reagent dispensing apparatus of claim 1 further comprising:
   a deposition chamber selected from a chemical vapor deposition chamber or an atomic layer deposition chamber;
   the vapor phase reagent discharge line connecting the vapor phase reagent dispensing apparatus to the deposition chamber;
   optionally a heatable susceptor contained within the deposition chamber and located in a receiving relationship to the vapor phase reagent discharge line; and
   an effluent discharge line connected to the deposition chamber;
   such that vapor phase reagent passes through the vapor phase reagent discharge line and into the deposition chamber, for contact with a substrate, optionally on the heatable susceptor, and any remaining effluent is discharged through the effluent discharge line.

6. A method for delivery of a vapor phase reagent to a deposition chamber comprising:
   (a) providing a vapor phase reagent dispensing apparatus comprising:
   a vessel which comprises a vessel top wall member, a vessel side wall member and a vessel bottom wall member configured to form an internal vessel compartment to hold a source chemical up to a fill level and to additionally define an inner gas volume above the fill level;
   said vessel top wall member having a single port capable of receiving a carrier gas and dispensing a vapor phase reagent;
   said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a bubbler extends;

said bubbler comprising a tube that extends through a centrally located portion of said first port portion and through said inner gas volume into the source chemical and through which a carrier gas can be bubbled into the source chemical to cause at least a portion of source chemical vapor to become entrained in said carrier gas to produce a flow of vapor phase reagent to said inner gas volume above the fill level, said tube having an inlet end located generally vertically and exteriorly from said first port portion and an outlet end located generally adjacent to the vessel bottom wall member;

said first port portion having interstitial space between said tube and said port side wall member through which said vapor phase reagent can be dispensed from the inner gas volume of said vessel;

said bubbler having a carrier gas feed inlet fitting connected thereto;

a carrier gas feed line extending from the carrier gas feed inlet fitting upwardly and exteriorly from the bubbler for delivery of carrier gas into the interior volume of the vessel, the carrier gas feed line containing a carrier gas flow control valve therein for control of flow of the carrier gas therethrough;

said third port portion having a vapor phase reagent outlet fitting connected thereto; and a vapor phase reagent discharge line extending from the vapor phase reagent outlet fitting upwardly and exteriorly from the third port portion for removal of vapor phase reagent from the interior volume of the vessel, the vapor phase reagent discharge line containing a vapor phase reagent flow control valve therein for control of flow of the vapor phase reagent therethrough;

(b) adding source chemical to said vapor phase reagent dispensing apparatus;

(c) heating the source chemical in said vapor phase reagent dispensing apparatus to a temperature sufficient to vaporize the source chemical to provide vapor phase reagent;

(d) feeding a carrier gas into said vapor phase reagent dispensing apparatus through said carrier gas feed line and said tube;

(e) withdrawing the vapor phase reagent and carrier gas from said vapor phase reagent dispensing apparatus through said vapor phase reagent discharge line; and (f) feeding the vapor phase reagent and carrier gas into said deposition chamber.

7. The method of claim 6 further comprising:

(g) contacting the vapor phase reagent with a substrate, optionally on a heatable susceptor, within the deposition chamber; and (h) discharging any remaining effluent through an effluent discharge line connected to the deposition chamber.

8. The method of claim 6 wherein, in the vapor phase reagent dispensing apparatus, said vessel bottom wall member has a sump cavity therein extending downwardly from the surface of said vessel bottom wall member.

9. The method of claim 6 wherein, in the vapor phase reagent dispensing apparatus, the source chemical comprises a liquid or solid material.

10. The method of claim 6 wherein, in the vapor phase reagent dispensing apparatus, the source chemical comprises a precursor for a metal selected from Group 2, Group 3, Group 4, Group 5, Group 6, Group 7, Group 8, Group 9, Group 10, Group 11, Group 12, Group 13, Group 14, Group 15, Group 16, and the Lanthanide series of the Periodic Table.

11. The method of claim 6 wherein, in the vapor phase reagent dispensing apparatus, the source chemical comprises a precursor for a metal selected from ruthenium, hafnium, tantalum, molybdenum, platinum, gold, titanium, lead, palladium, zirconium, bismuth, strontium, barium, calcium, antimony and thallium, or a precursor for a metalloid selected from silicon, germanium and tellurium.

12. The method of claim 6 wherein, in the vapor phase reagent dispensing apparatus, the vapor phase reagent comprises a precursor for a metal selected from Group 2, Group 3, Group 4, Group 5, Group 6, Group 7, Group 8, Group 9, Group 10, Group 11, Group 12, Group 13, Group 14, Group 15, Group 16, and the Lanthanide series of the Periodic Table.

13. The method of claim 6 wherein, in the vapor phase reagent dispensing apparatus, the vapor phase reagent comprises a precursor for a metal selected from ruthenium, hafnium, tantalum, molybdenum, platinum, gold, titanium, lead, palladium, zirconium, bismuth, strontium, barium, calcium, antimony and thallium, or a precursor for a metalloid selected from silicon, germanium and tellurium.

14. The method of claim 6 wherein the vapor phase reagent dispensing apparatus further comprises a carrier gas source coupled to the carrier gas feed line.

15. A liquid phase reagent dispensing apparatus comprising:

a vessel which comprises a vessel top wall member, a vessel side wall member and a vessel bottom wall member configured to form an internal vessel compartment to hold a source chemical up to a fill level and to additionally define an inner gas volume above the fill level;

said vessel top wall member having a single port capable of receiving an inert gas and dispensing a liquid phase reagent;

said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;

said first port portion having a port top wall member and a port side wall member, said port top wall member having an opening through which a diptube extends;

said diptube comprising a tube that extends through a centrally located portion of said first port portion and through said inner gas volume into the source chemical and through which liquid phase reagent can be dispensed from said apparatus, said diptube having an outlet end located generally vertically and exteriorly from said first port portion and an inlet end located generally adjacent to the vessel bottom wall member; and said first port portion having interstitial space between said tube and said port side wall member through which said inert gas can be fed to the inner gas volume above the fill level to pressurize the inner gas volume above the fill level.

16. The vapor phase reagent dispensing apparatus of claim 15 further comprising:

said third port portion having an inert gas feed inlet fitting connected thereto;

an inert gas feed line extending from the inert gas feed inlet fitting upwardly and exteriorly from the third port portion for delivery of inert gas into the interior volume of the vessel, the inert gas feed line containing an inert gas flow control valve therein for control of flow of the inert gas therethrough;

said diptube having a liquid phase reagent outlet fitting connected thereto; and a liquid phase reagent discharge line extending from the liquid phase reagent outlet fitting upwardly and exteriorly from said first port portion for removal of liquid phase reagent from the interior volume of the vessel, the liquid phase reagent discharge line optionally containing a liquid phase reagent flow control valve therein for control of flow of the liquid phase reagent therethrough.

17. The liquid phase reagent dispensing apparatus of claim 11 in which said vessel bottom wall member has a sump cavity therein extending downwardly from the surface of said vessel bottom wall member.

18. The liquid phase reagent dispensing apparatus of claim 15 further comprising an inert gas source coupled to the inert gas feed line.

19. A method for delivery of a vapor phase reagent to a deposition chamber comprising:
(a) providing a liquid phase reagent dispensing apparatus comprising:
a vessel which comprises a vessel top wall member, a vessel side wall member and a vessel bottom wall member configured to form an internal vessel compartment to hold a source chemical up to a fill level and to additionally define an inner gas volume above the fill level;
said vessel top wall member having a single port capable of receiving an inert gas and dispensing a liquid phase reagent;
said single port having a branched configuration comprising a first port portion extending generally vertically and exteriorly from said top wall member, a second port portion extending generally horizontally and exteriorly from said first port portion, and a third port portion extending generally vertically and exteriorly from said second port portion;
said first port portion having a port top wall member and a port side wall member, said port top wall member having an opening through which a diptube extends;
said diptube comprising a tube that extends through a centrally located portion of said first port portion and through said inner gas volume into the source chemical and through which liquid phase reagent can be dispensed from said apparatus, said diptube having an outlet end located generally vertically and exteriorly from said first port portion and an inlet end located generally adjacent to the vessel bottom wall member;
said first port portion having interstitial space between said tube and said port side wall member through which said inert gas can be fed to the inner gas volume above the fill level to pressurize the inner gas volume above the fill level;
said third port portion having an inert gas feed inlet fitting connected thereto;
an inert gas feed line extending from the inert gas feed inlet fitting upwardly and exteriorly from the third port portion for delivery of inert gas into the interior volume of the vessel, the inert gas feed line containing an inert gas flow control valve therein for control of flow of the inert gas therethrough;
said diptube having a liquid phase reagent outlet fitting connected thereto; and
a liquid phase reagent discharge line extending from the liquid phase reagent outlet fitting upwardly and exteriorly from the first port portion for removal of liquid phase reagent from the interior volume of the vessel, the liquid phase reagent discharge line optionally containing a liquid phase reagent flow control valve therein for control of flow of the liquid phase reagent therethrough;
(b) adding liquid phase reagent to said liquid phase reagent dispensing apparatus;
(c) optionally heating a solid source chemical in said liquid phase reagent dispensing apparatus to a temperature sufficient to melt the solid source chemical to provide liquid phase reagent;
(d) feeding an inert gas into said liquid phase reagent dispensing apparatus through said inert gas feed line;
(e) withdrawing the liquid phase reagent from said liquid phase reagent dispensing apparatus through said tube and said liquid phase reagent discharge line;
(f) providing a vaporization apparatus comprising:
a vessel configured to form an internal vessel compartment to vaporize the liquid phase reagent;
said liquid phase reagent discharge line connecting the liquid phase reagent dispensing apparatus to said vaporization apparatus;
a portion of the vaporization apparatus having a carrier gas feed inlet opening through which carrier gas can be fed into said vaporization apparatus to cause vapor of said liquid phase reagent to become entrained in said carrier gas to produce vapor phase reagent;
a portion of the vaporization apparatus having a vapor phase reagent outlet opening through which said vapor phase reagent can be dispensed from said vaporization apparatus;
a carrier gas feed line extending from the carrier gas feed inlet opening exteriorly from the vaporization apparatus for delivery of carrier gas into said vaporization apparatus, the carrier gas feed line containing one or more carrier gas flow control valves therein for control of flow of the carrier gas therethrough; and
a vapor phase reagent discharge line extending from the vapor phase reagent outlet opening exteriorly from the vaporization apparatus for removal of vapor phase reagent from said vaporization apparatus to said deposition chamber, the vapor phase reagent discharge line optionally containing one or more vapor phase reagent flow control valves therein for control of flow of the vapor phase reagent therethrough;
(g) feeding the liquid phase reagent into said vaporization apparatus;
(h) heating the liquid phase reagent in said vaporization apparatus to a temperature sufficient to vaporize the liquid phase reagent to provide said vapor phase reagent;
(i) feeding a carrier gas into said vaporization apparatus through said carrier gas feed line;
(j) withdrawing the vapor phase reagent and carrier gas from said vaporization apparatus through said vapor phase reagent discharge line; and
(k) feeding the vapor phase reagent and carrier gas into said deposition chamber.

20. The method of claim 19 wherein, in the liquid phase reagent dispensing apparatus, said vessel bottom wall member has a sump cavity therein extending downwardly from the surface of said vessel bottom wall member.

21. The method of claim 19 wherein, in the liquid phase reagent dispensing apparatus, the source chemical comprises a precursor for a metal selected from ruthenium, hafnium, tantalum, molybdenum, platinum, gold, titanium, lead, palladium, zirconium, bismuth, strontium, barium, calcium, antimony and thallium, or a precursor for a metalloid selected from silicon, germanium and tellurium.

* * * * *